(12) United States Patent
Dirksen et al.

(10) Patent No.: US 7,423,739 B2
(45) Date of Patent: Sep. 9, 2008

(54) METHOD OF AND SYSTEM FOR DETERMINING THE ABERRATION OF AN IMAGING SYSTEM TEST OBJECT AND DETECTOR FOR USE WITH THE METHOD

(75) Inventors: Peter Dirksen, Leuven (BE); Casparus Anthonius Henricus Juffermans, Leuven (BE); Augustus Josephus Elizabeth Maria Janssen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 492 days.

(21) Appl. No.: 10/499,271

(22) PCT Filed: May 3, 2002

(86) PCT No.: PCT/IB02/01485

§ 371 (c)(1),
(2), (4) Date: Feb. 2, 2005

(87) PCT Pub. No.: WO03/056392

PCT Pub. Date: Jul. 10, 2003

(65) Prior Publication Data

US 2005/0117148 A1    Jun. 2, 2005

(30) Foreign Application Priority Data

Dec. 24, 2001    (EP)    ................... 01205085

(51) Int. Cl.
*G01J 1/00* (2006.01)
(52) U.S. Cl. ...................................... 356/121; 356/614
(58) Field of Classification Search ......... 356/121–127, 356/603–620
See application file for complete search history.

(56) References Cited

U.S. PATENT DOCUMENTS

| 5,777,342 A * | 7/1998 | Baer .................... 250/492.2 |
| 6,570,143 B1 * | 5/2003 | Neil et al. ............... 250/201.9 |
| 2002/0041377 A1 * | 4/2002 | Hagiwara et al. ........... 356/399 |

OTHER PUBLICATIONS

"Aberration Measurement Method" Research Disclosure, Kenneth Mason Publications, Hampsire, GB, No. 450, Oct. 2001, pp. 1673.
Zach, F et al. "Aberration Analysis Using Reconstructed Aerial Images of Isolated Contacts on Attenduated Psase Shift Masks" Optical Microlithography XIV, Santa Clara, CA, USA Feb. 27-Mar. 2, 2001, vol. 4346, PT. 1-2, pp. 1362-1368.

* cited by examiner

*Primary Examiner*—Gregory J. Toatley, Jr.
*Assistant Examiner*—Tri T Ton
(74) *Attorney, Agent, or Firm*—Michael E. Belk

(57) ABSTRACT

For determining aberrations of an optical imaging system (PL), a test object (12,14) comprising at least one delta test feature (10) is imaged either on an aerial scanning detector (110) or in a resist layer (71), which layer is scanned by a scanning device, for example a SEM. A new analytical method is used to retrieve from the data stream generated by the aerial detector or the scanning device different Zernike coefficients (Zn).

23 Claims, 10 Drawing Sheets

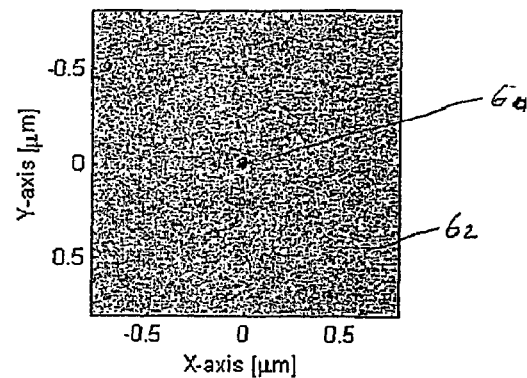
Fig. 10a
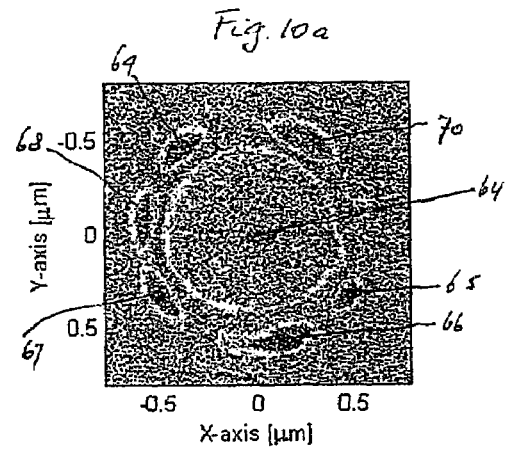
Fig. 10b
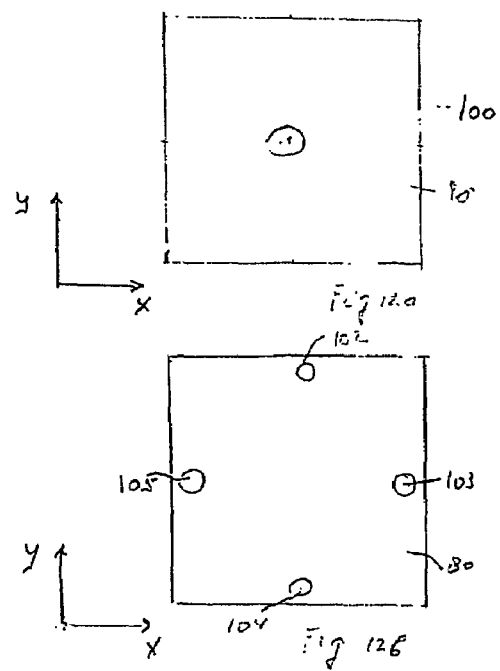
Fig. 12a
Fig. 12b

METHOD OF AND SYSTEM FOR DETERMINING THE ABERRATION OF AN IMAGING SYSTEM TEST OBJECT AND DETECTOR FOR USE WITH THE METHOD

The invention relates to a method of determining the aberration of an optical imaging system, which method comprises the steps of:
arranging a test object in the object plane of the imaging system;
forming a number of test object images by means of the imaging system and an imaging beam, each test object image being formed with another focus state of the imaging system;
detecting the test object image by means of a detection device having resolution larger than that of the imaging system, and
analyzing an output signal of the detection device to determine values of different aberration terms of the aberration.

The invention also relates to a system for performing the method, to a test object for use with the method, to a lithographic projection apparatus and to a method for manufacturing devices.

The resolution of an imaging system is understood to mean the ability of the system to reproduce object features, such as lines and points, as separate entities in the image. The higher the resolution of the system the smaller the resolvable distance between object features may be.

The optical imaging system may comprise refractive elements, reflective elements or a combination of both. An optical imaging system in the form of a projection system, having a large number of lenses or mirrors, is used in photo lithographic projection apparatuses, which are known as wafer steppers or wafer step-and-scanners. Such apparatuses are used, inter alia, for manufacturing integrated circuits, or IC's. In a photo lithographic projection apparatus a production mask pattern, present in a production mask is imaged a large number of times, each time on a different area, also called IC area, shot area or die, in a resist layer on top of the substrate. Imaging is performed by means of the projection system and a projection beam having a wavelength, for example 365 nm, in the UV range, or a wavelength, for example 248 nm, 193 nm or 157 nm, in the deep UV range.

The aim in IC manufacturing technology is to integrate an ever-increasing number of electronic components in an IC. To realize this, it is desirable to increase the surface area of an IC and to decrease the size of the components. For the projection system this means that both the image field and the resolution must be increased, so that increasingly smaller details, or line widths, can be imaged in a well-defined way in an increasingly larger image field. For this purpose a projection system is needed that complies very stringent quality requirements. Despite the great care with which such a projection system has been designed and the great accuracy with which the system is manufactured, such a system may still exhibit aberrations such as spherical aberration, coma and astigmatism, which are admissible for the envisaged application. In practice, a lithographic projection system is thus not an ideal system, but suffers from aberrations. Said aberrations are dependent on positions in the image field and are important sources of variations in the imaged line widths occurring across the image field. When specific techniques are used to enhance the resolution of a lithographic projection apparatus, such as the use of phase shifting masks, as described in, for example U.S. Pat. No. 5,217,831, or when applying off-axis illumination as described in, for example U.S. Pat. No. 5,367,704, the influence of the aberrations on the imaged line widths increases.

Moreover, in modern lithographic projection systems aberrations are not constant. To minimize low-order aberrations, such as distortion, field curvature, astigmatism, coma and spherical aberration, these systems comprise one or more controlled movable lens- or mirror-components. The wavelength of the projection beam or the height of the mask table may be adjustable for the same purpose. If these adjusting facilities are used, other and smaller, higher order, aberrations may be introduced. Moreover, since the intensity of the projection beam must be as large as possible, lithographic projection systems are subject to aging so that the extent of the aberrations may change with respect to time.

Based on the considerations described above, there is an increasing need for a reliable and accurate method of measuring aberrations. In the case of a modern lithographic projection system, which allows corrections to be made on the production site, the results of such a measuring can be used to correct the projection lens for such aberrations.

The paper "Aberration Analysis using Reconstructed Aerial Images of Isolated Contacts on Attenuated Phase Shift Masks" by Franz Zach et al in Proceedings of Spie, Vol. 4346, Optical microlithography XIV (2001), pages 1362-1368, disclose a method as described herein above in the opening paragraph. According to the method of this paper, isolated contact holes of different dimensions in a phase shift mask are imaged in a resist layer. A double exposure technique is used to reconstruct images: a single exposure of a contact hole is superimposed onto a uniform background exposure. In the experiment twenty resist images were used, each with a slightly higher background illumination dose than the previous one up to the so-called Dose to Clear. The background illumination is the result of the transmission characteristic of the attenuated phase shift mask. The resulting resist images are captured by a scanning electron microscope (SEM) with digital image acquisition and storage capabilities. These images are then analyzed off-line. Suitable threshold algorithms implemented on a general-purpose data analysis software package are applied to the stored images to obtain intensity contour lines of the set of images. From these values Zernike terms are deduced, which terms represent the type and amount of aberration terms in the observed image and thus those of the projection system.

In the known method, the measurement concentrates on the central region of the image of a contact hole, especially on the first side lobe of the contact-hole image. The image intensity of a ring at the location of the first side lobe is extracted from the image and analyzed for its Fourier components. Absolute calibration of the resulting Fourier terms is done by referencing them to the known transmission of the attenuated portion of the reticle. It is suggested that higher and lower Zernike terms can be separated by a "through focus" measurement. The latter means that a number of images are made of the same object (contact hole) at different focus conditions. As only the central portion of an image area is observed, the through focus range is small and aberrations effecting intensities to appear at larger distances from the center can not be observed. Moreover as explicitly stated in the paper the known method is not suitable for measuring rotationally symmetric aberrations like spherical aberration.

It is an object of the present invention to provide an aberration measuring method, which allows measuring also the aberrations excluded from the known method. This method is characterized in that:

the step of arranging the test object comprises including at least one test object feature having a size small compared to the resolution of the imaging system;

the step of detecting the test object image comprises detecting for all images of a test object feature the intensity profile across the whole image plane area associated with this test object feature, which image plane area is substantially larger than the first ring of the Airy distribution of the image of the test object feature, and the step of analyzing comprises solving at least one set of equations including radial parts of point spread functions, which result from the different aberration terms, to retrieve these aberration terms.

The new method uses the most simple and elementary test pattern that exists, for example an isolated transparent hole in a dark field binary mask. For a sufficient small hole diameter, small compared to the resolution of the imaging system, the image of the hole will approximate the point spread function of the imagining system. Exposing the mask through focus means that the intensity of the point spread function is measured in three dimensions. The point-spread function fully characterizes the imaging system and contains information about both the low and high order aberrations.

The method uses a novel analysis algorithm, a key feature of which is a novel function, which encompasses the assembly of radial parts of the point-spread functions associated with aberration terms and which provides the said set of equations. Whether one or two sets of equations have to be solved depends on the magnitude of the aberration and on the imaging conditions like the size of the test feature and the numerical aperture of the imaging system. When the aberration is small and the test feature has a small size, only one set of equations is to be solved. When the size of the test feature and the numerical aperture are larger and additional set of equations has to be solved.

The test object feature may be a delta test feature. Such a feature is understood to mean a feature, which, upon illumination with a beam of electromagnetic radiation (a light beam), creates an electromagnetic field whose electrical field vector as a function of position shows a sharp peak. For example a very small opening in a non-transparent layer constitutes such an object. Ideal for the measurement as such would be an infinitely small opening, but because the opening should transmit sufficient light to form a detectable image the opening should have a minimum size. In practice, an opening with a size substantially smaller than corresponding with the resolution of the imaging system is used. This size, i.e. the diameter of a round opening, is, for example, smaller than $\lambda/(2\,NA)$, for example $\lambda/(3\,NA)$, wherein $\lambda$ is the wavelength of the imaging beam and NA is the numerical aperture of the imaging system. For example, for $\lambda=193$ nm en NA=0.6 the diameter of the opening is of the order of 100 nm.

According to the new method the whole data volume resulting from the through focus measurement, i.e. the image intensities as a function of the polar coordinates r and $\theta$ and focus z, i.e. $I(r, \theta, z)$, is taken in and analyzed to derive the Zernike terms of the imaging apparatus aberrations. In the cited paper it is remarked that a drawback of the method described there is that the data volume to be processed is fairly large due to the large number of SEM images at different background doses and different focus conditions. In the method of the invention large data volume is no problem because use can be made of a new analytical algorithm for calculating aberrations from measured intensities, which algorithm has been developed by the inventors.

Furthermore, according to the new method for each image the intensity across the whole image area where radiation from the imaged opening may arrive is measured, thus also at a relative large distance from the center of the image, i.e. for a large r-value. This allows measurement of higher order Zernike terms, which produce radiation (hereinafter: higher order radiation) at larger distances from the image center. The unwanted radiation produced by higher order aberrations, are of similar nature as stray radiation, so that also the latter radiation is covered by the term: higher order radiation. The new method allows scanning through a larger focus range. For example, the focus range may extend from $-1$ μm to $+1$ μm out of focus, which is fairly large for a lithographic projection apparatus using a projection beam with a wavelength of 193 nm.

Higher order radiation may be deflected over a distance up to 100 μm at substrate level. Higher order radiation is caused, for example, by imperfection of lens- or mirror-coatings, imperfections of lens materials and unwanted reflections at the reticle or wafer (substrate). Although in current apparatuses higher order radiation may amount to several percent, it is likely that it will considerably increase in near future apparatuses, due to smaller wavelengths used therein. Especially apparatuses using projection radiation with a wavelength of 157 nm or EUV radiation most probably will show an increased amount of higher order radiation. Unfortunately, higher order radiation is not constant: it is different for projection systems of the same design, it varies over the image field of a projection system and is dependent on the illumination conditions. Moreover, due to contamination and degradation of lenses and/or mirrors, higher order radiation varies with time. Thus measuring and modeling of higher order radiation is highly desirable for a user of a projection apparatus. The present invention allows accurate mapping of fine higher order radiation distribution by illuminating a small test feature, for example a delta test feature having a diameter of the order of that of the central ring of the Airy distribution, thus using the point spread function of the imaging system.

According to an important aspect of the invention, the method is characterized in that the step of forming a test object image comprises imaging a matrix of test object features arranged at a mutual distance substantially larger than the size of the test feature and in that the succeeding steps are carried out for all test features simultaneously.

The use of a matrix of test object features provides additional advantages as will be explained hereinafter. By arranging the test object features at a mutual distance substantially larger than the size of the features cross talk between the several images, i.e. overlap in the image plane of the images of the several features, is prevented.

With respect to the image formation and detection, the method can be performed according to two main embodiments. The first main embodiment is characterized in that the step of forming a test object image comprises forming a test object image in a resist layer, in that this layer is developed and in that the developed image is detected by a scanning detection device.

The detection device may be a conventional scanning electron microscope, but also a newer type of scanning detection devices, like a scanning probe microscope, which is available in several implementations such as the atomic force microscope and the optical probe microscope, may be used. If use is made of a matrix of test object features, higher order radiation at different positions within the image field can be measured by means of a single exposure.

This embodiment is preferably further characterized by the additional step of imaging a reference feature for each test object feature in the resist layer before developing the resist layer.

By double exposure of the resist layer, one via the test object feature, for example a delta test feature, and the other via the reference feature, each test object feature image will be provided with a position reference for the intensity distribution scanning action, so that it will be clear which of the measured intensities belongs to which (r,θ) position.

A first sub-embodiment of the first main embodiment is characterized in that the additional step comprises forming a point-shaped reference feature in the center of the image field of each test object feature.

This reference feature, at the position r=0 in the image field of test object feature, may be formed by exposing the resist layer via a circular opening and its position is determined by the axis of the imaging system.

A second sub-embodiment is characterized in that the additional step comprises forming a circle-shaped reference feature at the rim of yje image field of each test object feature.

A third sub-embodiment is characterized in that the additional step comprises forming pairs of opposite line-shaped reference features in the image field of each test object feature.

The second main embodiment of the method is characterized in that the step of forming a test object image comprises forming an aerial image on a radiation-sensitive detector.

The higher order radiation is now directly measured, without a resist as intermediate medium so that the measurement is not influenced by the characteristics of a resist layer.

This main embodiment of the method, if performed with a matrix of test object features, may be further characterized in that the step of forming a test object image comprises simultaneously forming an aerial image of each test object feature on a separate detector area.

This embodiment allows increasing the signal-to-noise ration of the detector signals, or determining aberrations without scanning, or through-focus measuring without movement of the detector and the imaging system relative to each other.

The method may be used, inter alia, for detecting aberrations of a projection system in a lithographic projection apparatus suitable for projecting a mask pattern, present in a production mask, on a production substrate provided with a resist layer. The embodiment for this application is characterized in that a mask having at least one test object feature is arranged at the position of the production mask in the projection apparatus and in that either a resist layer or a radiation-sensitive detection device is arranged at the position of the production substrate.

A production substrate is understood to means a substrate on and in which a device, like an integrated circuit, is to be formed. Such a substrate is also called a wafer. A production mask is understood to mean a mask provided with a pattern of device features, for example an IC pattern, that is to be transferred to the production substrate.

This embodiment may be further characterized in that use is made of a test object, which forms part of a test mask.

A dedicated test mask does not comprise a production pattern of features, for example an IC pattern, that is to be transferred to a production substrate, but only a test object and possibly features which may be helpful for performing the measurement.

Alternatively the embodiment may be characterized in that use is made of a test object, which forms part of a production mask.

A test object according to the invention can be arranged in a production mask outside the area of the pattern of device features. Such a production mask allows to increase the throughput, i.e. the number of substrates that can be processed per unit of time, of the projection apparatus, because loading and unloading of a test mask is no longer necessary.

The invention further relates to a system for performing the method described herein above. This system is constituted by the combination of:
  an apparatus of which the imaging system forms part;
  a test object having at least one test object feature;
  detection means for detecting the intensity distribution in the image field of said at least one test object feature;
  an image processor, coupled to the detection means, for analyzing said intensity distribution. This system is characterized in that the image processor comprises analysis means for processing information about said distribution, which is determined by the point spread function of the imaging system, to determine different types of aberrations the imaging system may show.

This system may be further characterized in that the detection means comprises a resist layer for receiving an image of the at least one test object feature and a scanning detection device for scanning the test object feature image formed and developed in the resist layer.

The system may alternatively be characterized in that the detection means comprises a radiation-sensitive detector for receiving an aerial image of the at least one test object feature.

The aerial image detector may be a scanning point detector, which views at any time during the scanning action only a small portion of a test feature image area.

Preferably, the test object comprises a number of test object features and the aerial detector is a scanning composed detector comprising a radiation-sensitive member and a number of transparent point-like areas, corresponding to the number of test features in the test object. With such a detector the image fields of all test object features are scanned simultaneously.

If the radiation-sensitive member is a single element covering all transparent areas, the signal-to-noise ratio of the signal is substantially increased, because radiation from all transparent areas is integrated.

The radiation-sensitive member may also be composed of a number of sub-members, which number corresponds to the number of transparent areas.

If the position of a transparent area relative to the center of the corresponding sub-member is different for the several transparent area/sub-member pair, the whole image field of a test feature can be measured without scanning the detector across the field.

If the several transparent areas are arranged at different distances from the imaging system, scanning through focus can be realized without moving the detector and the imaging system relative to each other along the optical axis of the imaging system.

The invention also relates to a lithographic projection apparatus for imaging a production mask pattern, present in a mask, on a substrate, which apparatus comprises an illumination unit for supplying a projection beam, a mask holder for accommodating a mask and a substrate holder for accommodating the substrate, which apparatus is suitable for performing the method as described herein above. This apparatus is characterized in the imaging system is constituted by a projection system arranged between the mask holder and the substrate holder, in that during performing the method the projection beam is used as imaging beam and in that the illumination unit comprises means for reducing, during performance of the method, the diameter of the projection beam cross-section to a value smaller than the cross-section diameter the projection beam has during projection of the production mask pattern.

Said means for reducing allow adaptation of the cross-section of the imaging beam to the size of the test object feature so that a signal with improved signal to noise ration is obtained.

A further adaptation to the method of the invention is realized in a lithographic projection apparatus, which is characterized in that it comprises an aerial image detecting radiation-sensitive detector as described herein before for the system for performing the method.

Such a detector can be arranged on the substrate stage of the apparatus.

Alternatively the method as described herein above can be performed with a dedicated measuring device, which can easily be put in and removed from the lithographic projection apparatus. This measuring device is characterized in that it has the shape and dimensions of a production substrate and comprises electronic signal processing means, power supply means, interface means and at least one detector for detecting intensity profiles in images of test object features.

The detector of this measuring device may be constructed as described herein above.

Furthermore the invention relates to a test object for use with the method as described herein above. This test object has one or more of the characteristic features of the above mentioned embodiments of the method relating to the test object.

If this test object is implemented as a test mask wherein an outer area, which forms a portion of the mask surface surrounds each test object feature, it may be further characterized in that each outer area is provided with a recognition mark. Then the scanning device can easily find the image of a test object feature.

The test object may be further characterized in that for each test object feature navigation marks are arranged in an intermediate area between the test object feature and the outer area.

In addition, the test object may be characterized in that for each test object feature further marks comprising information about the test object feature and/or its position on the mask surface are arranged in the outer area of the test object feature.

With respect to its optical character, the test object may show different embodiments.

A first embodiment is characterized in that the test object has an amplitude structure.

A second embodiment is characterized in that the test object has a phase structure.

Both embodiments may be realized as a transmission test object or a reflective test object.

An important aspect of the invention relates to the retrieval method for retrieving different aberrations terms of the aberration of an optical imaging system from a data stream representing intensity distribution in an image formed of a test object by means of the imaging system. This method is characterized by the steps of:
  transforming the observed intensity distribution having been measured in rectangular coordinates into an intensity distribution as a function of polar coordinates and focus condition $I(r,\phi,f)$;
  determining the Fourier expansion $\Psi(r,f)$ of the observed image intensity;
  determining in the (r,f) space the inner product of the Fourier expansion $\Psi(r,f)$ and the aberration phase $\Phi$, and
  solving at least one set of linear equations, which are the result of the preceding steps and include radial parts of point-spread functions, which result from the different aberration terms, to retrieve these terms.

The invention is also implemented in a computer program comprising software for performing this retrieval method.

Finally the invention relates to a process of manufacturing devices comprising device features in at least one substrate layer of device substrates, which process comprises at least one set of the following successive steps:
  providing a production mask pattern comprising features corresponding to device features to be configured in said layer;
  imaging, by means of a controlled projection system, the production mask pattern in a resist layer coated on the substrate and developing this layer thereby forming a patterned coating corresponding to the production mask pattern;
  removing material from, or adding material to, areas of the substrate layer, which areas are delineated by the pattern of the patterned coating, whereby controlling of the projection system comprises detection of aberrations of the projection system and re-setting of elements of this system dependent on the result of the detection. This process is characterized in that the detection is performed by means of the method as described herein above.

These and other aspects of the invention are apparent from and will be elucidated, by way of non-limitative example with reference to the embodiments described hereinafter.

In the drawings:

FIGS. 10a and 10b show a SEM picture of a delta test feature and the intensity distribution produced thereby, respectively;

FIGS. 12a, 12b and 12c shows different embodiments of a reference mark to be used for each delta test feature;

Figure 1:
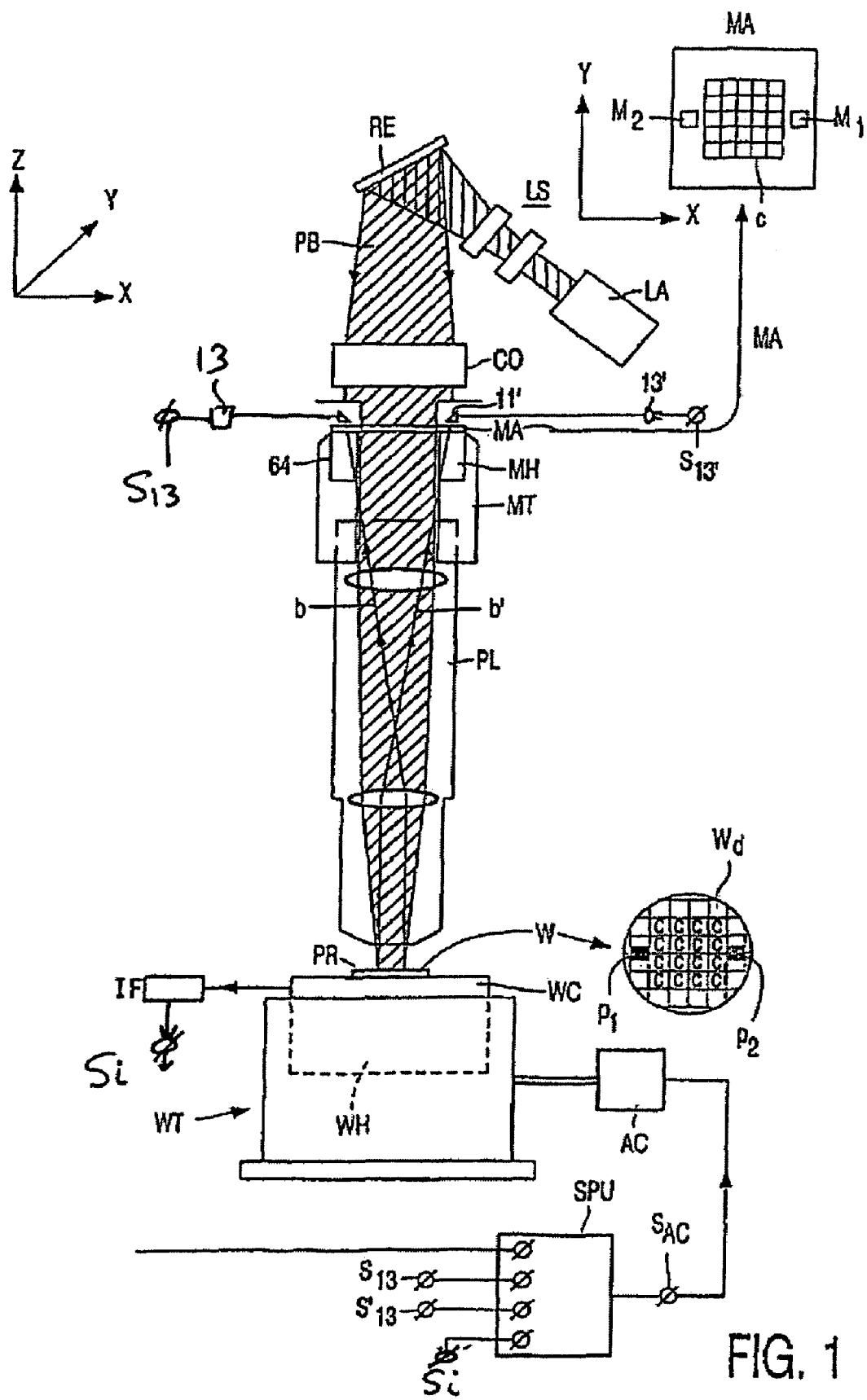
FIG. 1 shows diagrammatically an embodiment of a photolithography projection apparatus with which the method can be performed.

FIG. 1 shows diagrammatically only the most important optical elements of an embodiment of a lithographic apparatus for repetitively imaging a mask pattern on a substrate. This apparatus comprises a projection column accommodating a projection lens system PL. Arranged above this system is a mask holder MH for accommodating a mask MA in which the mask pattern C is provided, for example, where the mask pattern C may include an integrated circuit (IC) pattern to be imaged. The mask holder is present in a mask table MT. A substrate table WT is arranged under the projection lens system PL in the projection column. This substrate table supports the substrate holder WH for accommodating a substrate W, for example, a semiconductor substrate, also referred to as wafer. This substrate is provided with a radiation-sensitive, or resist, layer PR on which the mask pattern must be imaged a number of times, each time in a different IC area Wd. The substrate table is movable in the X and Y directions as indicated in the Figure so that, after imaging the mask pattern on an IC area, a subsequent IC area can be positioned under the mask pattern.

The apparatus further comprises an illumination system, which is provided with a radiation source LA, for example, a krypton-fluoride excimer laser or a mercury lamp, a lens system LS, a reflector RE and a condenser lens CO. The projection beam PB supplied by the illumination system illuminates the mask pattern C. This pattern is imaged by the projection lens system PL on an IC area of the substrate W. The illumination system may be implemented as described in EP-A 0 658 810. The projection system has, for example, a magnification M=¼, a numerical aperture NA=0.6 and a diffraction-limited image field with a diameter of 22 mm.

The apparatus is further provided with a plurality of measuring systems. One of these systems is an alignment detection system for measuring alignment of the mask MA and the substrate W with respect to each other in the XY plane. Another measuring system is an interferometer system for determining the X and Y positions and the orientation of the substrate holder and hence of the substrate. Also present is a focus error detection system. This system determines a deviation between the focal or image plane of the projection lens system PL and the surface of the resist layer PR. The measuring systems form parts of servo systems, which comprise electronic signal processing and control circuits and drivers, or actuators. By means of these circuits and drivers the position and orientation of the substrate and the focusing can be corrected with reference to the signals supplied by the measuring systems.

The alignment system uses two alignment marks M1 and M2 in the mask MA, denoted in the top right part of FIG. 1. These marks preferably consist of diffraction gratings. Alternatively they may be constituted by other marks such as squares or strips which are optically different from their surroundings. The alignment marks are preferably two-dimensional, i.e. they extend in two mutually perpendicular directions, the X and Y directions in FIG. 1. The substrate W has at least two alignment marks, preferably also two-dimensional diffraction gratings, two of which, P1 and P2, are shown in FIG. 1. The marks P1 and P2 are located outside the area of the substrate W where the images of the pattern C must be formed. The grating marks P1 and P2 are preferably implemented as phase gratings, and the grating marks M1 and M2 are preferably implemented as amplitude gratings. The alignment system may be a double alignment system in which two alignment beams b and b' are used for imaging the substrate alignment mark P2 and the mask alignment mark M2, or the substrate alignment mark P1 and the mask alignment mark M1 on each other. After having passed the alignment system, the alignment beams are incident on symmetrically arranged radiation-sensitive detectors 13, 13'. These detectors convert the relevant beam into an electric signal, which is indicative of the extent to which the substrate marks are aligned with respect to the mask marks, and thus the substrate is aligned with respect to the mask. A double alignment system is described in U.S. Pat. No. 4,778,275, which is referred to for further details of this system.

For an accurate determination of the X and Y positions of the substrate, a lithographic apparatus is provided with a multiple axis interferometer system, which is diagrammatically shown by way of the block IF in FIG. 1. A two-axis interferometer system is described in U.S. Pat. No. 4,251,160, and a three-axis system is described in U.S. Pat. No. 4,737,823. A five-axis interferometer system is described in EP-A 0 498 499, with which both the displacements of the substrate along the X and Y axes and the rotation about the Z axis and the tilts about the X and Y axes can be measured very accurately.

A step-and-scan lithographic apparatus does not only comprise a substrate interferometer system but also a mask interferometer system.

As is diagrammatically shown in FIG. 1, the output signal Si of the substrate interferometer system and the signals $S_{13}$ and $S'_{13}$ of the detectors 13, 13' of the alignment system are applied to a signal-processing unit SPU, for example, a microcomputer. This unit process said signals to control signals $S_{AC}$ for an actuator AC with which the substrate holder is moved, via the substrate table WT, in the XY plane.

The projection apparatus further comprises a focus error detection device, not shown in FIG. 1, for detecting a deviation between the focal plane and the projection lens system PL and the plane of the resist layer PR. Such a deviation may be corrected by moving, for example, the lens system and the substrate with respect to each other in the Z direction or by moving one or more lens elements of the projection lens system in the Z direction. Such a detection device, which may be fixed, for example, to the projection lens system, is described in U.S. Pat. No. 4,356,392. A detection device with which both a focus error and a local tilt of the substrate can be detected is described in U.S. Pat. No. 5,191,200.

Very stringent requirements are imposed on the projection lens system. Details having a line width of, for example 0.35 μm or smaller should still be sharply imaged with this system, so that the system must have a relatively large NA, for example, larger than 0.6. Moreover, this system must have a relatively large, well-corrected image field, for example, with a diameter of 23 mm. To be able to comply with these stringent requirements, the projection lens system comprises a large number, for example, tens of lens elements. Each of these lens elements must be made very accurately and the system must be assembled very accurately. A good method of determining whether aberrations of the projection system are small enough to render this system suitable to be built into a projection apparatus, as well as to allow detection of aberrations during the lifetime of the apparatus, is the indispensable The latter aberrations may have different causes. Once the aberrations and their magnitudes are known, measures can be taken to compensate for them, for example by adapting position of lens elements or pressure in compartments of the projection system.

Figure 2:
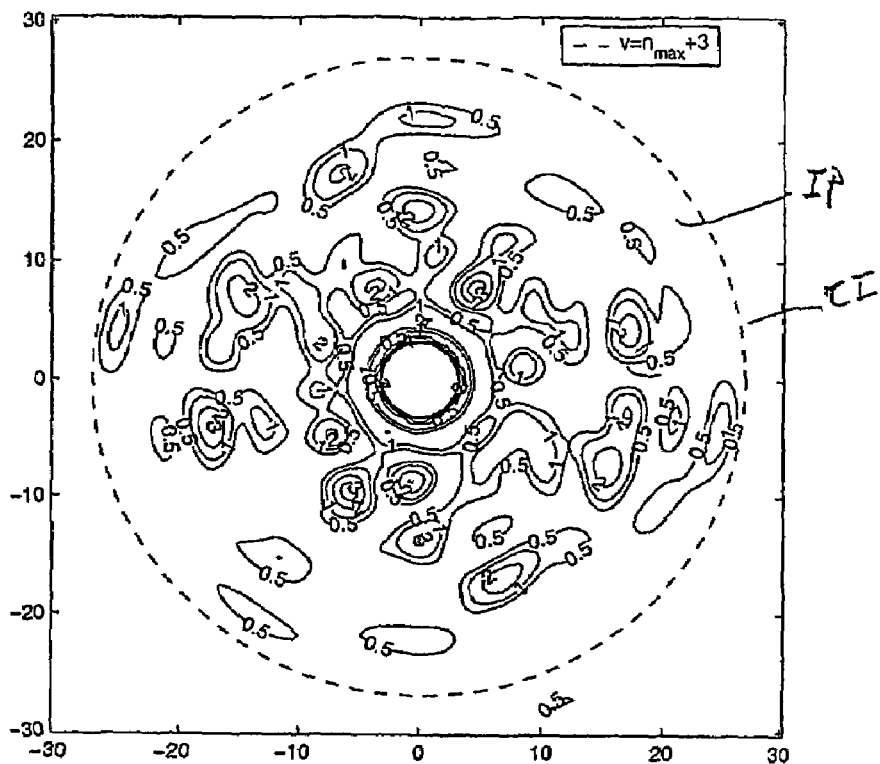
FIG. 2 shows an intensity distribution produced by art imaging system.

By way of example, FIG. 2 shows an image space intensity distribution IP calculated for the case a point source is imaged by means of an imaging system showing higher order aberrations. These aberrations, which may be due to manufacturing errors, generate higher order Zernike coefficients in the wave front, which excites from the imaging system. The low intensity part of the calculated pattern outside the central lobe comprises a large number of contours, defining areas of constant intensity. The pattern of contours resembles a speckle pattern. This can be explained by the non-correlated nature of the higher order Zernike coefficients. The numerals attached to the contours represent the relative intensity, in percents of the maximum intensity in the central lobe. To prevent that too many contours would arise in the central part of the pattern so that this part would appear black, the central maximum has been limited or truncated to, for example, 3% of the real maximum. The diffracted intensity is concentrated within a circle CI given by v=n+3, the extent of the highest order Bessel function present in the image plane intensity function. The character v represents the dimensionless radial coordinate and n is the expected highest Zernike coefficient.

According to the invention use is made of the optical impulse response, or point spread function to determine aberrations of the projection system. Furthermore, for analyzing the observed images new and unique analytical expressions are used also for the higher order aberrations. According to a key feature of this method a small test object feature having a size smaller than the resolution of the imaging system is illuminated. This test feature may be a delta feature. A delta feature is an object feature having a size, for example a diameter, substantially smaller than the resolution of the optical system by means of which radiation from the test object is concentrated in a resist layer or an aerial radiation detector. An example of such a delta test feature is a pinhole. Only if a small test feature is used the fine structure, including the higher order aberrations of the intensity distribution will be observable.

For measuring an intensity distribution as shown in FIG. 2 in the image plane of the projection system of a lithographic projection apparatus, this apparatus may be used as a part of the measuring system. A test mask having at least one test object feature, for example a delta test feature in the form of a pinhole is arranged in the mask holder. This pinhole is imaged in the resist layer in the same way as a production mask pattern is imaged in the resist layer during the production process. Subsequently, the substrate is removed from the apparatus and developed and etched so that an image of the pinhole is transferred in a relief image pattern in the substrate is obtained. Subsequently, this relief image is scanned by a scanning detection device, for example, a scanning electron microscope. The electron microscope converts the observed image into image data, which are processed in an image-processing device, using a special, analytical, image-processing algorithm so that the image data can be visualized in diagrams or graphs. It is alternatively possible to show visual images of the structures observed by the electron microscope on, for example, a monitor.

Figure 3:
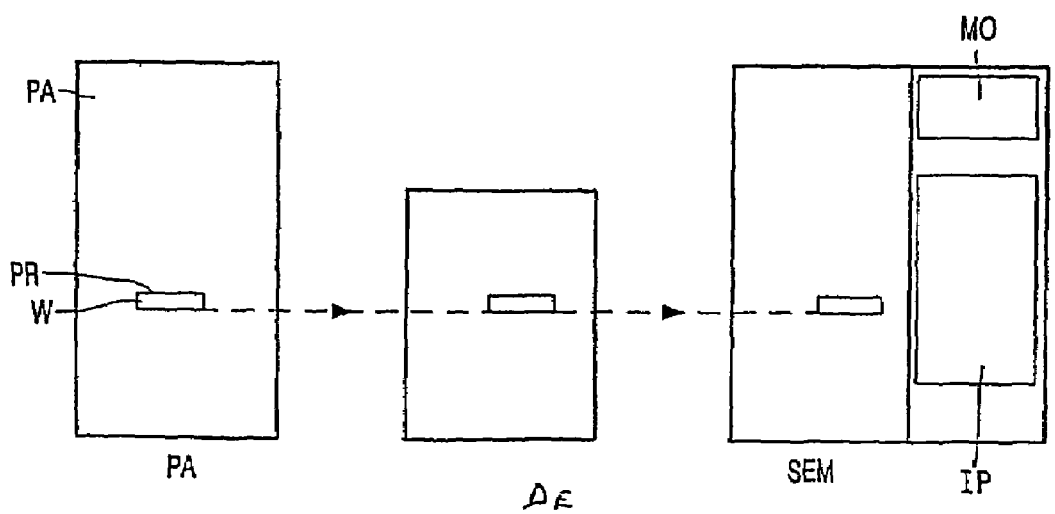
FIG. 3 shows a block diagram of a system for performing the method.

FIG. 3 shows a block diagram of the method of producing an image of a delta feature in a resist layer and determining the intensity distribution of this image. In this FIG. the projection apparatus, which imaging quality is to be measured, is denoted by block PA. The developing and etching apparatuses are denoted by block DE. The block SEM comprises the scanning electron microscope or, in general a scanning detection device. The block IP within the block SEM denotes the image-processing device and block MO the monitor.

Figure 4:
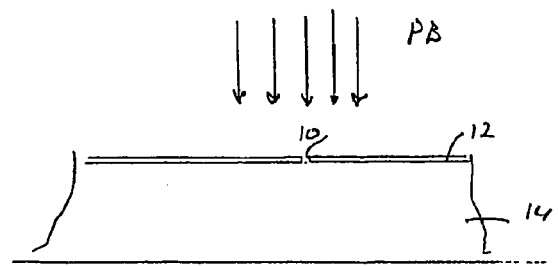
FIG. 4 shows a first embodiment of a delta test feature and the intensity thereof as produced by a perfect imaging system.
Figure 4:
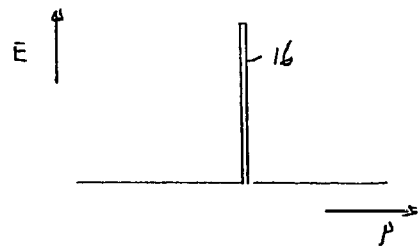
Figure 4:
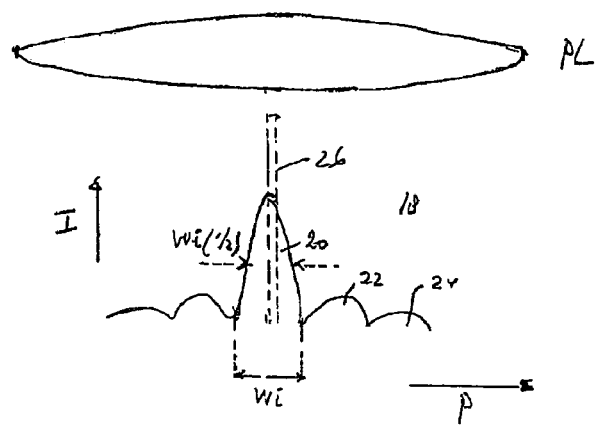

As shown in the vertical cross-sectional FIG. 4 the delta test feature of the test object may be constituted by a minute transparent opening 10 or pinhole in a non-transparent plate or layer 12 on a transparent substrate 14. The substrate may be of glass or quartz and the non-transparent layer may be a chromium layer. For carrying out the method the opening is illuminated by the projection beam PB, which is a beam of electromagnetic radiation. After passage through the opening 10 the electromagnetic field has an electric field vector E, which magnitude varies as a function of the position p as represented by graph 16. After passage of the projection lens system PL, diagrammatically represented by the single lens in FIG. 4, the electromagnetic field has an intensity distribution 18, which is called Airy distribution. The intensity is the square of the amplitude, i.e. the magnitude of the electric field vector E' at the image side of the projection-lens system. The perpendicular slopes of graph 16 have been converted in oblique slopes and the needle-like field of this graph has changed in a central lobe 20 with a number of side lobes at both sides. FIG. 4 shows only two side lobes, 22 and 24 at both sides. The intensity distribution 18 is caused by the fact that the projection lens system, even when it is free of aberrations, is not an ideal system but has a point spread function. This means that a point is not imaged as a point, as is represented by trhe broken line graph 26 in FIG. 4, but that the radiation of the point is more or less spread across an Airy pattern. The width wi of central lobe 20, and thus the half-value width wi(½), is determined by the point spread function of the projection lens. The half-value width is understood to mean the width of the lobe at the position where the intensity is half the maximum intensity.

The Airy intensity distribution 18 represents the theoretical situation, which holds only for an ideal lens system, i.e. a lens system without aberrations. Lens aberrations cause radiation energy to move from the central lobe of the Airy pattern to rings around this lobe. The larger the aberration order is, i.e. the higher the number of the Zernike term, the larger the distance of the intensity caused by this aberration order is from the centre. Using a delta test feature having a size smaller than, for example, corresponding to ⅓ of, the half value width of the Airy central lobe, allows measuring, in a relative large field, the fine intensity distribution caused by the aberrations up to the very high orders, i.e. very high numbers of Zernike terms, for example 169. The term corresponding has been used to indicate that the magnification of the lens system should be considered.

Illumination of a transparent opening in a non-transparent area is known in optics as dark-field illumination. The measurement of the invention may also be carried out with light-field illumination. The delta test feature is then a minute non-transparent area 28, for example a chromium dot, in a transparent layer 30 or on a transparent plate 14, for example of glass or quartz, as shown in FIG. 5.

Figure 5:
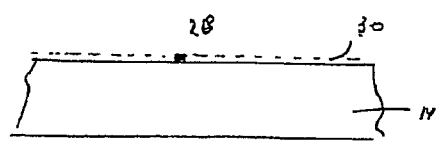
FIG. 5 shows a second embodiment of the delta test feature.
Figure 6:
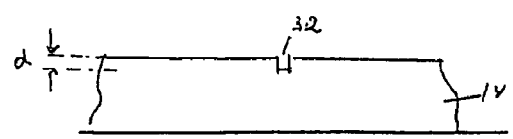
FIG. 6 shows a third embodiment of the delta test feature.

Instead of the transparent/non-transparent, i.e. amplitude, structure of FIGS. 4 and 5 also a phase structure may be used as test object. A delta feature having such a phase structure is shown in FIG. 6. It consists of a minute-area recess 32 having a depth d in a transparent plate 14. Instead of a recess, also a minute-area raised portion may be used having the same area size and the same height difference with respect to the rest of the plate as said recess. Since the plate, for example a test mask, is sufficiently transparent to the projection beam with which the test feature is imaged, this feature forms a phase structure for this beam. This means that, after passage through the plate, the part of the projection beam PB incident on the area 30 has obtained a different phase than the rest of the beam. The phase difference $\phi$ (in rad.) between the beam portions is defined by $$\varphi = \frac{(n_2 - n_1) \cdot d \cdot 2\pi}{\lambda}$$

in which $n_2$ is the refractive index of the plate material, $n_1$ is the refractive index of the surrounding medium which is generally air, with n=1, and λ is the wavelength of the projection beam PB.

For obtaining a good contrast in the image plane, the phase difference between the beam portion which has passed through the area 32 and the rest of the beam must be φ=π rad. This means that the optimum depth d of the recess is equal to the wavelength of the beam PB if the refractive index of the mask material is 1.5 and the surrounding medium is air having a refractive index of 1. Useful results can still be obtained at depths different from the optimal depth.

Instead of a transmission object as shown in FIGS. 4, 5 and 6, the test object may also be a reflective object. A reflective test object will be used for measuring apparatus wherein the wavelength of the imaging, or projection, beam is so low that materials, which are sufficiently transparent for radiation of this wavelength, are not available. The imaging system should then be constructed of mirrors and also the test object should be a reflective object. A reflective test object will be used, for example, for measuring a lithographic projection apparatus wherein extreme UV (EUV) radiation, having a wavelength of, for example 13 nm, is used as projection beam radiation.

Figure 7:
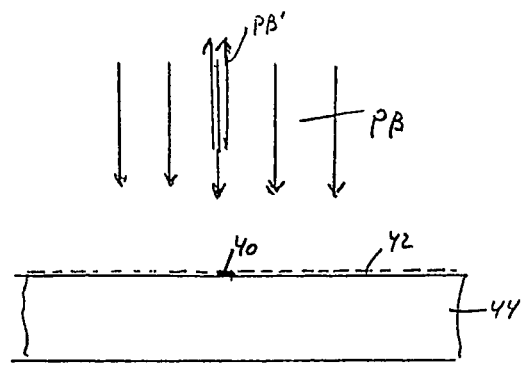
FIG. 7 shows a fourth embodiment of the delta test feature.

FIG. 7 shows a first embodiment of a reflective delta test feature, consisting of a minute reflective area 40 in a non-reflective layer 42 or on a non-reflective plate or mask substrate 44. This is the reflective variant of the dark-field transmission feature of FIG. 4.

Figure 8:
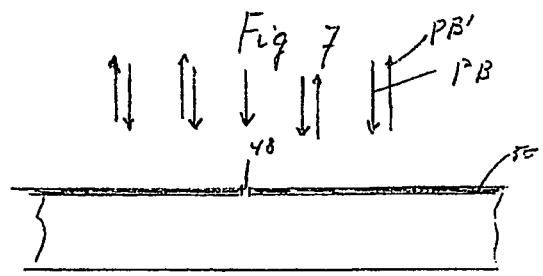
FIG. 8 shows a fifth embodiment of the delta test feature.

FIG. 8 shows a second embodiment of the reflective delta test feature, consisting of a minute non-reflective area 48 in a reflective layer 50. This is the reflective variant of the light-field transmission feature of FIG. 5.

Figure 9:
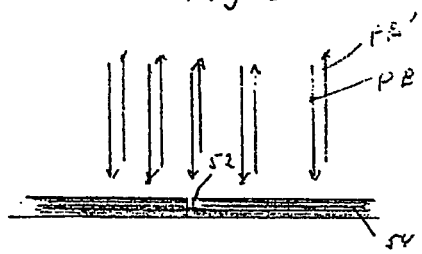
FIG. 9 shows a sixth embodiment of the delta test feature.

FIG. 9 shows a third embodiment of the reflective delta test feature, consisting of a minute-area recess 52 in a reflective layer 54. This is the reflective variant of the transmission phase feature of FIG. 6. The recess 52 may also be replaced by a raised layer portion.

For the reflective delta test feature the optimum depth or height is a quarter of the wavelength of the projection beam PB.

Upon illumination of each one of the delta test features of FIGS. 4-9, the radiation from such a feature and passing through the lens or mirror or combined projection system will produce an intensity distribution in the resist layer. In the ideal case, i.e. a projection system without aberrations, this distribution is an Airy distribution like the distribution 18 in FIG. 4. In practice the distribution is more extended and irregular due to aberrations of different kinds of the projection system.

By way of example, FIG. 10a shows a SEM picture of a delta test feature, consisting of an opening 34 in a chromium layer 35 on a quartz substrate. The diameter of the opening is chosen such that on wafer scale it about 0.1 μm, thus 0.4 μm on mask scale if the imaging system has a magnification of ¼. FIG. 10b shows a SEM image of this test feature in a resist layer. This image is obtained with an imaging system having a numerical aperture of 0.60 and using radiation having a wavelength of 193 nm. The central region 64 in the image is surrounded by non fill annular regions 65-70 at relative large distances from the centre which have non-zero intensity, which means that the imaged system used has higher-order aberrations.

In general, the aberrations, like coma, astigmatism, three-points- and spherical aberrations, are composed of lower and higher order Zernike coefficients. The lower order and higher order coefficients cause an intensity to appear more close to and more remote from the central lobe of the Airy distribution, respectively. A Zernike coefficient of an aberration may produce intensity at the same position as another Zernike coefficient of another aberration. In order to determine from which aberration intensity at a given position stems, scanning through focus is used. Thereby use is made of the fact that different aberrations change in a different way when scanning through focus, i.e. moving the image of the test feature along the optical axis of the projection lens system in the +Z direction and the –Z direction with respect to the resist layer. This movement can be realized by changing the focus of the projection system or by moving this system and the resist layer with respect to each other in the Z direction. In practice, for thorough focus scanning the resist layer will be moved because substrate stages used in optical lithography are provided with means for very accurately moving the substrate in the Z direction. The nature of the present measuring method allows scanning over a Z-range, which is substantially larger, for example between –1 μm and +1 μm, than the Z range usually exploited in lithographic apparatuses. The focus range that will be used in lithographic projection apparatus wherein projection radiation with a wavelength of 193 nm or 157 nm is used, of the order between –0.1 μm and +0.1 μm.

Figure 11:
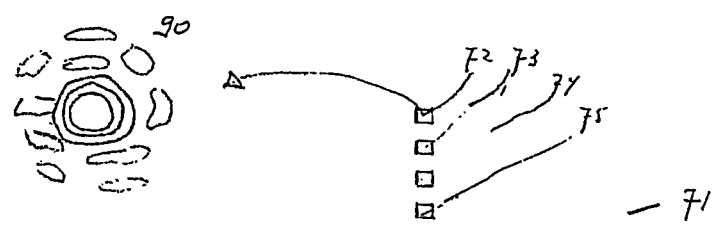
FIG. 11 shows a wafer resist layer with a number of delta test feature images distributed across its surface.
Figure 11:
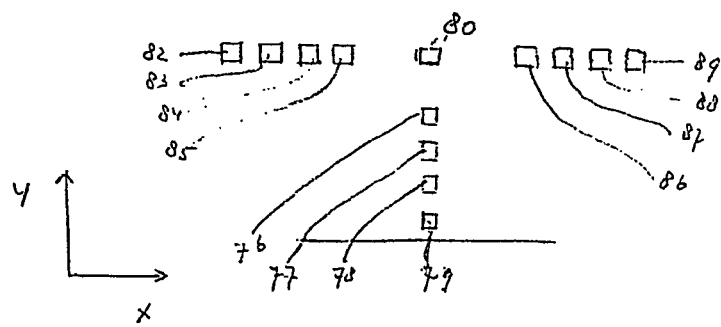

For each focus condition a separate intensity distribution is needed. In order to determine the influence of the illumination dose, for each focus s condition the test feature should be imaged a number of times, each time with a different predetermined illumination dose from low to high. Thus for each focus condition a number of intensity distributions are produced in the resist layer. Producing such a focus exposure matrix (FEM) in the resist layer allows reconstruction of intensity levels, which are not visible in the developed resist images. This is illustrated in FIG. 11, which shows, by way of example, a top view of an array of exposed areas 72-80 in a resist layer 71 on top of a wafer (not shown). These successive areas have been illuminated via a delta test feature, whereby for each area another focus setting has been chosen. The central area 80 has been illuminated at optimum focus condition. The border area 72 has been illuminated with a defocus of, for example, +1 μm and the areas 73-75 with successive smaller+defocus. The border area 79 has been illuminated with a defocus of, for example –1 μm and the areas 78-76 with successive smaller–defocus. The number of areas in the array may be much larger than the few areas shown in FIG. 11. The different doses used with each focus condition are represented by the series of areas 82-89 for the focus condition during imaging in area 80. Area 82 has been illuminated with a small dose and area 89 with a high dose. For each of the areas 72-79 a series of areas like the series 82-89 is produced in the resist layer. All exposed areas in FIG. 11 are provided with an intensity distribution 90 shown for the area 62, whereby the distributions in the different areas are different.

In addition to the area series 72-80 and 82-89 a large number of areas may be exposed with different focus settings and/or doses. This allows increasing the accuracy and reliability of the measurement.

The intensity distributions can be observed by developing and etching the resist layer so that this distribution is converted to a profile structure, and by scanning this structure. Scanning is performed by means of a scanning microscope having a resolution which is larger than the resolution of the projection system, which is proportional to λ/NA of this system. A scanning electron microscope, which may have a magnification of the order of 100,000 and can observe details of the order of 3.5 nm, is eminently suitable for this purpose, particularly if a large number of images must be measured. It is alternatively possible to use other scanning microscopes in the form of, for example, probe microscopes such as an optical probe microscope or an AFM (Atomic Force Microscope) or hybrid forms thereof.

For each of the exposed areas in the resist layer the intensity I as a function of the polar co-ordinates ρ (radius) and θ (azimuth) and of f (focus state), i.e. I(ρ,θ,f), is determined and the data about the different areas are processed simultaneously.

For comparing the intensity distributions in the several exposed areas, in each area a position reference is needed. Such a position reference may be constituted by a pattern etched in the wafer carrying the resist layer. It is also possible to provide the resist layer with the reference mark by means of a double exposure procedure. According to this procedure first a reference mark is imaged in the resist layer area destined for an image of the delta test feature and then the delta test feature itself is imaged in this area.

The position reference mark may be constituted by small spot 100 in the centre of an image area, such as area 80, of a delta test feature, as shown in FIG. 12a. This spot is obtained by exposing the area 80 through a (mask) opening having a diameter larger than the resolution of the imaging system to be measured.

FIG. 12b shows a second embodiment of the position reference mark. This mark consists, for example, of four spots 102-105 at opposed border positions in the image area 80 of the intensity distribution of the test feature.

Figure 12C:
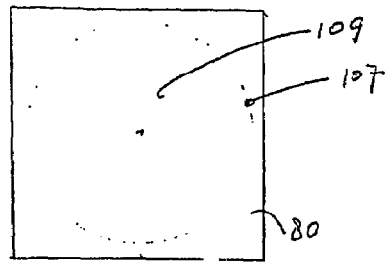

FIG. 12c shows a third embodiment of the position reference mark. This mark consists of a circle 107 around the region 109 of the image area 80 where the intensity contours are expected to appear.

Figure 13:
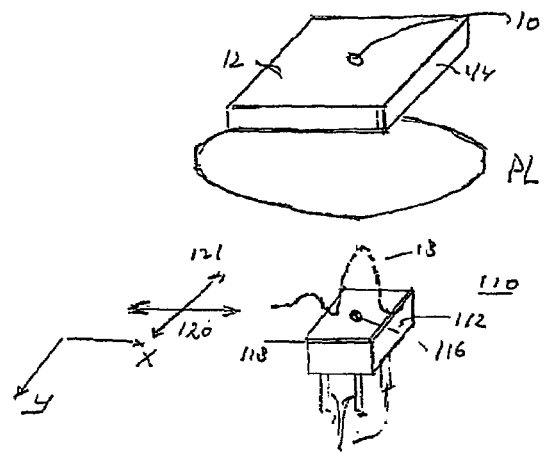
FIG. 13 shows a test object with a single delta test feature and an aerial detector for scanning the intensity distribution produced by this feature.

The intensity distribution produced by an imaging system from a delta test feature can also be observed directly by a radiation-sensitive detector. The possibly influence of resist characteristics on the measurement is then excluded. The detector, which observes an aerial image, may be called an aerial detector. FIG. 13 shows diagrammatically a measuring system using such an aerial detector. In this FIG., reference numerals 10, 12, 14 denote the test object of FIG. 4. The delta test feature 10 has, for example, a diameter of the order of 100 nm. This feature, i.e. opening, is imaged by the projection system PL as a point spread function indicated by the Airy distribution 18. The aerial detector 10 is arranged close to the image plane of the projection system. This detector may consist of a conventional radiation sensitive detector 112 with leads 114 and having a small opening 116 in a cover layer 118. The opening 16 has a diameter of, for example of the order of 100 nm. For measuring the intensity distribution in the image area of the test feature, which area is, for example 300×300 µm², the aerial detector is scanned across the image area, as indicated by the arrow 120.

The aerial detector allows considerable improvements of the measuring system with respect to the signal to noise ratio of the detector signal and with respect to the measuring time.

Figure 14:
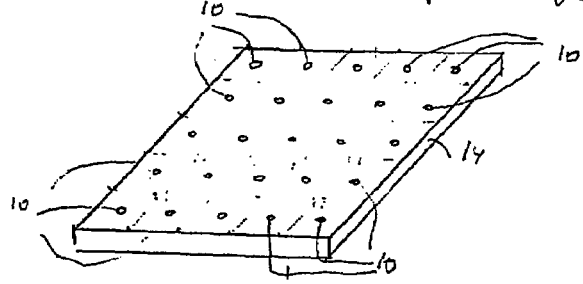
FIG. 14 shows a test object with a number of delta test features and a first embodiment of a composed aerial detector for use with this test object.
Figure 14:
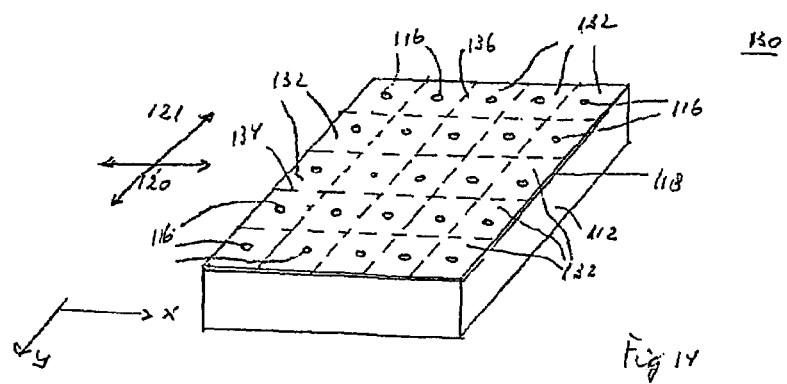

To increase the measured intensity, the aerial detector may be provided with a matrix of openings, for example thirty openings along the x direction and thirty openings along the y direction, so in total 900 openings. FIG. 14 shows a portion, comprising twenty-five openings 116, of such a detector 130 and the test object that is used in combination with such a detector. This FIG. is similar to FIG. 13, with the exception that the intensity distribution and the projection system are omitted for clearness sake. Each of the openings in FIG. 14 is the same as opening 116 in FIG. 13, and may have a diameter of the order of 100 nm. The openings are spaced from each other by, for example 2 µm. Radiation passing through all openings is captured by a common radiation detector 112. With such a detector the intensity distribution produced by a test object having a corresponding number of delta test features 10, all being the same as test feature 10 in FIG. 13, can be scanned simultaneously. Thereby each opening scans a separate image field belonging to the corresponding delta test feature 10 in the test object. These imaged fields are denoted by reference numeral 132 and delineated by the broken lines 134 and 136 in the x direction and the y direction, respectively. The detector 112 receives radiation from all the openings simultaneously, which means that at each moment the intensities at the same locations in all image fields 132 are integrated. Thus by means of the embodiment with a test object having n delta test features and an aerial detector having n openings an image signal is obtained having an amplitude that is n times the signal amplitude obtained with a single test feature and a detector with a single opening. The image signal is understood to mean the signal that represents the intensity at the momentarily scanned location in an image field 132.

Figure 15:
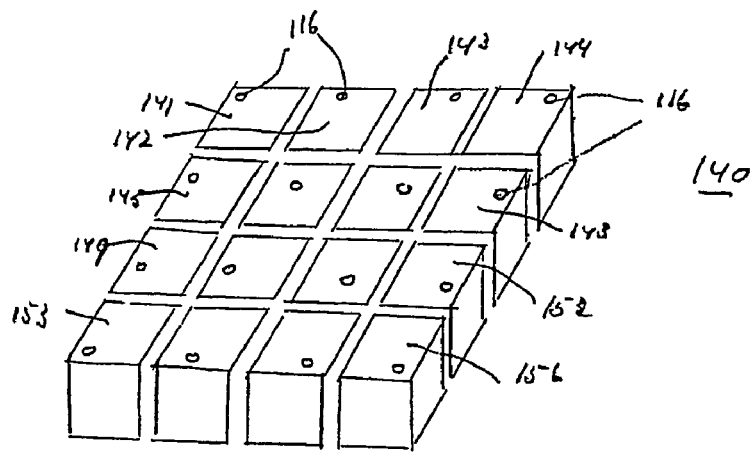
FIG. 15 shows a second embodiment of the composed aerial detector.

The test object having a number of delta test features may also be used with a multiple opening aerial detector having separate, small detector elements. FIG. 15 shows a top view of a portion of such a composed detector 140, which portion comprises sixteen detector elements 141-156. The opening 116 of each of the detector elements may be the same as the opening 116 in FIG. 13 or 14. For all of the detector elements the position of the opening with respect to the centre of the detector element is different. As shown in FIG. 15, the openings of the succeeding of elements of all rows (141-144 in the first row and 153-156 in the last row) are shifted from the left to the right whilst the openings in all columns (141, 145, 149 and 153 in the first column and 144, 148, 152 and 156 in the last column are shifted from the upper side to the underside. The aerial detector of FIG. 15 may comprise, for example thirty rows and columns, so nine hundred detector elements and the shift of the openings is considerably smaller than show in FIG. 15. Each detector element of the composed detector looks at a different point of the same intensity distribution. This allows observing the whole intensity distribution of a delta test feature in one measuring step. In the embodiment of the method wherein the composed detector is used the radiation passing through the openings 116 are not integrated, as was the case in the embodiment of FIG. 14, so that the composed detector 140 receives less radiation than the detector 130 of FIG. 14. This can be compensated by enlargement of the measuring time, so that integration over time is obtained. During the measuring action the detector is stationary in the x- and y-direction.

Figure 16:
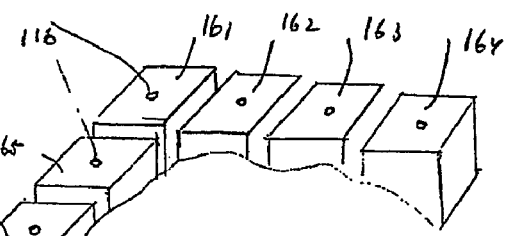
FIG. 16 shows a perspective view of a third embodiment of the composed aerial detector.

Another embodiment of a composed aerial detector allows a through focus measuring without moving the projection system and the detector relative to each other. FIG. 16 shows a perspective view of a portion of such a detector 160. For clearness sake, only the top row and the left column of detector elements are shown. The rows and columns may comprise, for example thirty detector elements, of which only four, 161-164 and 161, 165-167, respectively are shown. The openings 116 of the detector elements are all arranged at the same positions, for example in the centre of the element. The detector elements have different heights: in the first row from left to right the height decreases and in the left column the height decreases from the upper side to the underside. Each of the detector elements is thus arranged at a different distance to the projection system When a test object comprising a number of delta test features corresponding to the number of detector elements, is imaged on the composed detector 160, the focus conditions for all test features are different. This means that for an intensity distribution point facing the opening 116 a through focus scan is carried out in space, instead of in time, and without movement of the detector and the projection system relative to each other. For measuring the whole intensity distribution produced by the delta test feature the composed detector 160 should be scanned in the x- and y-direction as indicated by the arrows 120, 121.

Figure 17:
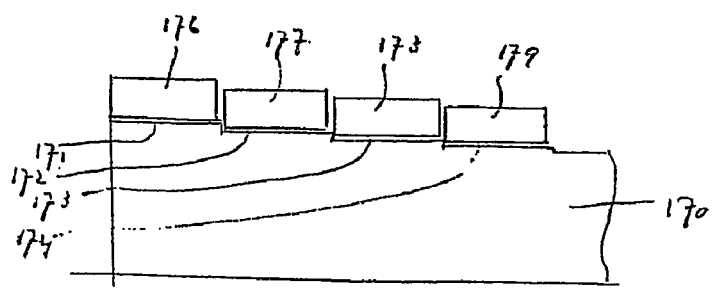
FIG. 17 shows a cross-section of one row of detector elements of this detector.

The stepped detector 160 may be manufactured by etching a substrate, for example of silicon, to different heights and building up a semiconductor radiation sensor 175 on each of the different-height substrate areas 170-174, as shown in FIG. 17 for one the rows of FIG. 16.

Figure 18:
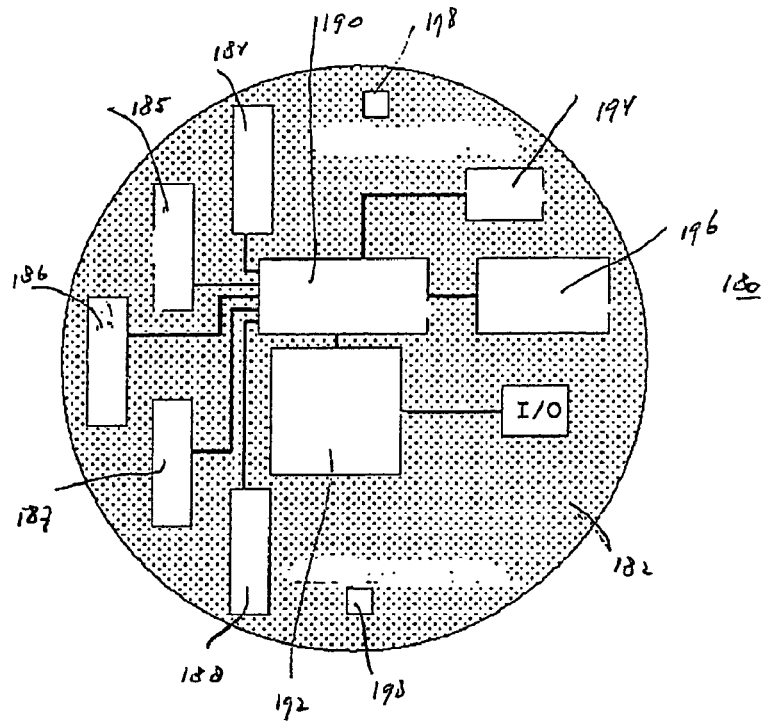
FIG. 18 shows an embodiment of an optical measuring wafer.

When used for detecting aberrations in a lithographic projection apparatus, a specific optical measuring device can be used to perform the present method. FIG. 18 shows an embodiment of such a device 180. It comprises a substrate 182, which has the shape and dimensions of a production wafer for use in the apparatus of which projection system the aberrations have to be measured. The device, which comprises at least one sensor and may be called optical measuring wafer or wafer sensor provides the advantage that it can be easily loaded in and unloaded from the apparatus, like a production wafer. Moreover when loaded in the apparatus, the optical measuring wafer is automatically positioned in the right position. The embodiment of FIG. 18 comprises five sensors 184-188. At least one of the sensors is a single detector or a composed detector as shown in FIG. 13 and FIGS. 15-17, respectively. The sensors may be distributed over the whole wafer surface and may be arranged at different heights. The sensors may be provided with an amplifier to amplify the sensor signal before it is supplied to a microprocessor, also arranged on the wafer. The functions of the microprocessor are a/o processing the sensor signals and controlling the sensors. The measuring wafer may comprise also a memory 192 for temporarily storing data a/o signal data. Block 194 is an input/output interface, which is connected to the microprocessor and provides for a wired or wireless contact with the environment. The wireless contact may be provided, for example with optical means or by FM transmission. The interface is used for supplying output data to the environment and/or loading a measurement program into the microprocessor. The measuring wafer is powered by power supply 196, which may be a battery or an induction device for wireless receiving electrical power from the environment. The measuring wafer comprises also two or more alignment marks to align the wafer in the lithographic projection apparatus before measuring starts.

For deriving aberrations of the projection system, or an imaging system in general, the image data obtained by scanning the intensity distributions should be processed. The date processing comprises a number of steps, which can be divided into two groups. The first group of steps comprises:
  removing noise from the incoming image data;
  determining the contours of the image, for example, by differentiation, or by determining how far the intensity of each observed pixel is under a given threshold, and:
  determining the point of gravity of the intensity distribution of the observed image;

The second group of processing steps relates to a new analytical method. This method uses the theory on computation of optical point spread functions both for point-like objects and extended objects under various illumination conditions, as disclosed in the article: "Assessment of an extended Nijboer-Zernike approach for the computation of optical point spread functions" by J. Braat et al, to be disclosed in the May 2002 Volume of Journal of the Optical Society of America. In this article the extended Nijboer-Zernike approach is used to compute the point spread function of an imaging system having different types of aberrations when scanning through focus. In the new analytical method the extended Nijboer-Zernike approach to retrieve the phase defects, i.e. aberrations, of the system from intensities when scanning through focus. As the Nijboer-Zernike theory is based on assumptions, which severely limits its value in practice, this theory has been practically abandoned, certainly for larger aberrations. Moreover theory does not allow introducing defocus terms. The new analysis method using the extended Nijboer-Zernike overcomes the problems inherent to the conventional Nijboer-Zernike theory and allows calculation of both small and large aberrations and also of high order aberration terms. The term "extended" in the name of the new theory refers to the fact that it allows defocus terms to be introduced. The defocusing effect is taken as an independent parameter and this effect, i.e. scanning through focus, is effectively used for calculating the different types of aberrations.

Essential in the calculation scheme of the new analysis method, which may be called the extended Nijboer-Zernike algorithm, is a new function in the expression for the point spread function. This new function, which is dependent on the radial coordinate and the defocus parameter, comprises for a specific aberration a specific Bessel series. With the extended Nijboer-Zernike algorithm all cases of practical interest can be covered. Because of the analytical nature of the formulas used in the algorithm, there are no discretization effects limiting the accuracy as opposed to the conventionally used numerical packages based on brute force integration methods.

According to the present invention the aberrations are determined by the following steps:
  transforming the observed intensity having been measured in rectangular coordinates into an intensity as a function of polar coordinates, i.e. $I(r,\phi,f)$;
  determining the Fourier expansion $\Psi(r,f)$ of the observed image intensity;
  determining in the $(r,f)$ space the inner product of the Fourier expansion $\Psi(r,f)$ and the aberration phase $\Phi$, and solving a set of linear equations, which are the result of the preceding steps and which include radial parts of point spread functions, which result from the different aberration terms, in order to retrieve these aberration terms.

This computation is elucidated in appendix titled: "Basic formula's for the computation of electrical field of the point spread function" (hereinafter appendix A) and in the appendix titled: "Determination of aberrations" (hereinafter appendix B). Appendix A summarizes the basic formulas from the above-mentioned article, which are relevant for the computation. Appendix B describes the new method of calculating aberrations from the measured intensities.

The above-mentioned new function is $V_{nm}(r,f)$ (hereinafter second $V_{nm}$), which appears in appendix B in the expression for the point spread function on the line between Eq. 10 and Eq. 11. This $V_{nm}(r,f)$ is a special case of the function $V_{nm}(r,f)$ appearing in Eq. 3 of appendix A (hereinafter first $V_{nm}$). For, the second $V_{nm}(r,f)$ holds under the conditions that the aberrations of the imaging system are relative small, that the numerical aperture o this system is not large and that the test feature, i.e. the pinhole has a diameter substantially smaller than the resolution of the imaging system. For these conditions the Zernike coefficients $\alpha_{nm}$ belonging to this "basic" $V_{nm}$ are small and real coefficients, whilst the corresponding coefficients $\beta_{nm}$ in Eq.3 are in general complex coefficients. As will be demonstrated herein after, $V_{nm}$ functions, which are modifications of the basic $V_{nm}$ function, can still be used if the above-mentioned conditions are not fulfilled.

In general, a single aberration $R_{mn}(\rho,\theta) \cdot \cos(m,\theta)$ in the wave front from the exit pupil will result in a point spread function $V_{nm}(r,f) \cdot \cos(m,\phi)$. If the wave front shows more aberrations a corresponding number of point spread will occur. The complexity of the point spread function depends on the specification of the imaging system being measured and the test feature used for this measuring. All aberrations of the imaging system can be expressed in $V_{nm}$ functions, which are more or less complex, but can be calculated in a relative easy way. It will be sufficient to include of the order of twenty terms in the infinite Bessel series to obtain the required accuracy. The $V_{nm}$ function, which plays a key role in the analysis of the intensity distribution, can be defined as the radial part of the $(n,m)^{th}$ basic point spread function at defocus f.

Eq. 10 of appendix A relates to the phase errors, i.e. aberration phase $\Phi$, of a imaging system, which can be retrieved according to the method if the aberrations of the system are small (a corrected system). The through-focus point-spread function is expressed as a combination of basic functions. The coefficients of these basic functions are identical to the Zernike coefficients and are estimated by optimizing the match between the theoretical intensity and the measured intensity patterns at several values of the defocus parameter. However, the new method is not limited to retrieval of phase errors, but can be extended to retrieve more general aberrations. As can be taken from appendix A, the full aberration function $A.\exp(i\Phi)$ can be written as:

$$A(\rho,\theta)\exp[i\phi(\rho,\theta)] = \Sigma_{nm}\beta_{nm}R_n^m(\rho)\cos(m\theta)$$

wherein $A(\rho,\theta)$ is the amplitude or transmission of the pupil and $\phi(\rho,\theta)$ the phase error of the imaging system. The method using the extended Nijboer-Zernike algorithm is thus capable to retrieve not only phase errors of an imaging system, but also transmission, or amplitude, errors, which is a unique capability of this method.

To determine both amplitude and phase aberrations, which need not te be small, use can be made of Eq. 3 in appendix A. This Eq, expresses the electrical field $U(x,y)$ of a wave front comprising such a general aberration as a series expansion using the new function $V_{nm}(r,f)$ The coefficients $\beta_{nm}$ can now be retrieved by defining two, instead of one, sets of basic functions:

$$\psi_n^m = 4Re\{i^{m+1}V_{00}^*V_{nm}\}$$

$$X_n^m = 4RE\{i^m V_{00}^*V_{nm}\}$$

wherein the * indicates complex conjugation, Again the match between the theoretical and observed intensity pattern is optimized. By solving these two sets of linear equations the imaginary and real parts of the $\beta_{nm}$ coefficients can be retrieved.

Although in appendix B it is assumed that the diameter of the test feature, the pinhole, is substantially smaller than the resolution of the imaging system, so that this test feature approximates a mathematical delta function, and that the NA of the system is small, the novel method is not limited to these conditions. Fortunately, it has turned out that the finite pinhole diameter can be taken into account analytically, simply by modifying the focus parameter $f$ into:

$$\tilde{f} = f + i\frac{1}{8}d^2$$

wherein $d = 2\pi NA/\lambda^* D$ is the scaled, i.e. normalized, hole diameter D. This equation holds for the case that the test feature radius is small compared with the radius of the imaging beam and thus with the radius of the portion of pupil of the imaging system illuminated by this beam. In a lithographic projection apparatus this radius can easily be set so that this condition can easily be fulfilled.

For larger test feature radius the focus parameter f can be modified into:

$$\tilde{f} = f + i\left(\frac{1}{8}d^2 + \frac{1}{384}d^4\right)$$

or, even better, $$\tilde{f} = f + i\left(\frac{1}{8}d^2 + \frac{1}{384}d^4 + \frac{1}{10240}d^6\right)$$

The radial functions $V_{nm}(r,f)$ are then modified to $V_{nm} = V_{nm}(r,\tilde{f})$, but the phase retrieval procedure is the same as described herein above. Note that the new function $V_{nm}$ allows processing of complex defocus values. Thus, a test feature with a relative large diameter may be used. This means that the exposure dose needed to obtain a sufficient signal to noise ratio may remain small so that the method of measuring can be easily carried out in practice.

More generally, the focus parameter $f$ may be modified to accommodate additional corrections for both a (large) test feature size and high numerical aperture, for example larger than 0.7, of the imaging system. Generally, the focus parameter $f$ can be modified to $\tilde{f} = ib(z)$, where the function $b(z)$ is a complex function depending on the wavelength $\lambda$, the numerical aperture NA and the test feature size D, for which an explicit analytical procedure exists. In particular, $\lambda$, NA and D depend linear on the physical defocus value z.

For an imaging system having a large numerical aperture, for example from 0.8 on, incident beam portions make relative large angles with the system surfaces. For such large angles the behavior of components of the system become dependent on the polarization state of the imaging beam. Such components are, for example, lens or mirror coatings and lens material, especially for short wavelength apparatus. A calcium fluoride lenses which is used with 157 nm wavelength radiation is birefringent and its optical behavior is thus dependent on the polarization state of the radiation beam incident on it. To measure aberrations of imaging system with large numerical apertures the new method has to be performed with two beams having mutually perpendicular polarization states. If for a high NA imaging system to be measured it is known with which polarization state it will be used the aberration measurement can be performed with an imaging beam having this polarization state.

The major aberrations of the projection lens system are coma, astigmatism, three-point (three-leaf) aberration, and spherical aberration. Each of these aberrations are usually represented by a Zernike coefficient, i.e. an amount of a specific Zernike polynomial from the "fringe Zernike code".

A list of thirty-seven Zernike terms Z with their polynomials is given in table I. This table is known from the manual for the optical lithography simulation program "Solid C", propriety of the firm Sigma C. Such a table can also be deduced from the well-known handbook: "Principles of Optics" by Born & Wolf. As can be taken from table 1, for spherical aberration the low order Zernike coefficient is Z9 and the higher order coefficients are Z16, Z25, Z36 and Z37. For X-coma the low order coefficient is Z7 and the higher order coefficients are Z14, Z23 and Z34, whereas for Y-coma these coefficients are Z8 and Z15, Z24, Z35 respectively. For astigmatism, i.e. H/V or horizontal/vertical astigmatism, the low order coefficient is Z5 and the higher order coefficients are Z12, Z21 and Z32, whereas for astigmatism at $45^{hu\,0}$ these coefficients are Z6 and Z13, Z22, Z33, respectively. For three-point aberration in the x direction the low order coefficient is Z10 and the higher coefficients are Z19 and Z30, whereas for the three-point aberration in the y direction these coefficients are Z11 and Z20, Z31 respectively.

Figure 19:
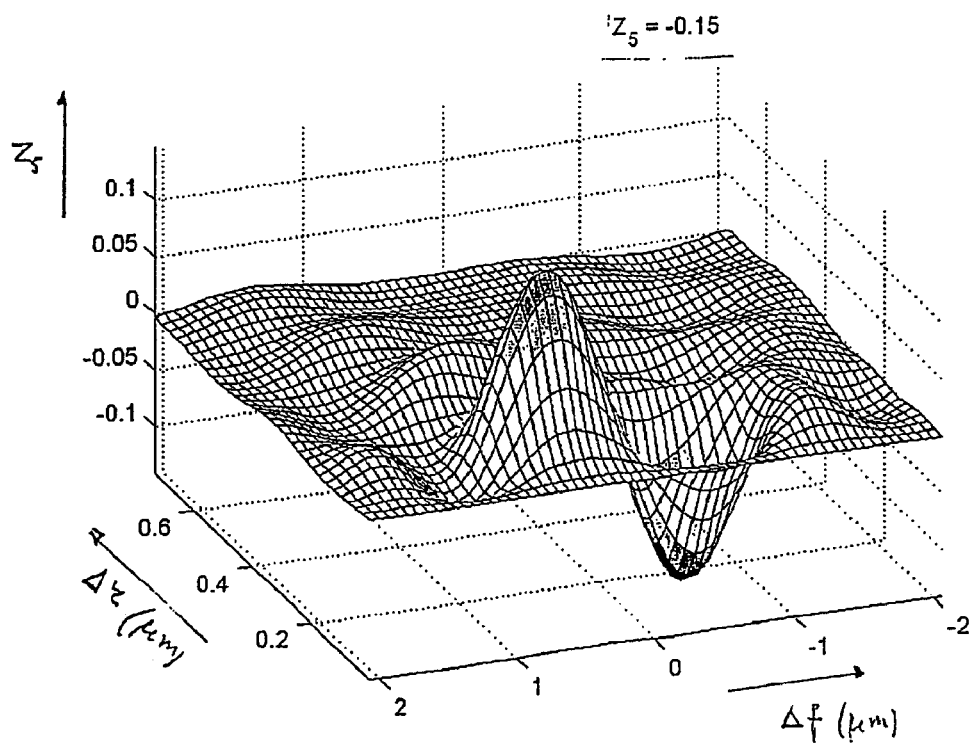
FIG. 19 shows the variation of an astigmatic aberration as a function of radial position and defocus.

By way of example, FIG. 19 shows a two-dimensional representation of a three three-dimensional surface that represents the experimentally obtained variation of the astigmatic Zernike coefficient Z5 across the image field of a delta test feature. In this FIG., $\Delta f$ denotes the focal axis and $\Delta 3$ denotes the radial axis. FIG. 19 shows that the sign of the aberration, i.e. astigmatism, changes when passing through the focal point (FA).

The description has hitherto been based on a single test object. However, a test mask may have a large number of test objects patterns, for example three in the x direction and 15 in the y direction. The test objects can be arranged such that they cover the whole image field of, for example a step-and scanning apparatus, which field is typically 8 mm in the x direction and 26 mm in the y direction. This allows determining aberrations in the whole scanned image field. The number of test objects may also be larger or smaller. If aberration detection is performed by means of an aerial detector technique, for each of the test objects a separate aerial detector should be provided. If the test objects comprises a number of delta test features, for example 100×100, each of the (composed) aerial detector should comprises a corresponding number of openings. If aberration detection is performed by means of imaging in a resist layer, each of the test objects comprises one delta test feature.

Since the test patterns are so small, they may also be provided in a production mask, i.e. a mask with an IC pattern, without this being at the expense of the details of the relevant IC pattern. Then it is not necessary to manufacture separate test masks and to exchange masks for measuring aberrations.

For performing the detection method by means of a lithographic projection apparatus, the projection beam preferably has a small beam cross-section at the location of the mask so that a maximal quantity of projection radiation is concentrated on the test object and a clear image is obtained. Novel generations of lithographic projection apparatuses have special illumination systems, which provide, inter alia, the possibility of adapting the cross-section of the projection beam, with the total radiation energy of the beam being maintained. Such an illumination system is described, for example, in the article: "Photolithography using the AERIAL illuminator in a variable NA wafer stepper" SPIE Vol. 2726, Optical Microlithography IX, 13-15 Mar. 1996, pp. 54-70. The ratio between the cross-section of the projection beam and the pupil cross-section is denoted by $\sigma$, or degree of coherence. For projecting the mask pattern, $\sigma$ values of between 1 and 0.3 are currently used. In accordance with the invention, such a lithographic apparatus can be made eminently suitable for performing the novel method of measuring aberrations if the means for limiting the beam cross-section are implemented in such a way that the $\sigma$ values can be set at the order of 0.2 or less. These means can be obtained by adapting the beam-limiting means already present in the lithographic apparatus in such a way that the cross-section of the projection beam can be made considerably smaller than the beam cross-section which is used for projecting the mask pattern on the substrate. This further reduction of the beam cross-section can then be realized while maintaining the total energy in the beam. For the aberration measurements, it is alternatively possible to arrange an extra diaphragm in the radiation path between the radiation source and the mask holder, the aperture of said diaphragm being adjustable in such a way that $\sigma$ values of between 1 and, for example, 0.1 can be adjusted.

The invention can be used both in a stepping- and a step-and-scanning lithographic projection apparatus. In a stepping apparatus a whole mask pattern is illuminated and imaged in a first IC area. Subsequently the mask pattern and the substrate are moved with respect to each other until a subsequent IC area is positioned under the mask pattern and the projection system, hence one step is made. Then this IC area is illuminated with the mask pattern, another step is made again, and so forth until the mask pattern has been imaged on all IC areas of the substrate. To alleviate the requirements of a large NA and a large image field imposed on the projection lens system and/or to increase the resolution and the image field of the apparatus, a step-and-scanning apparatus is preferably used. In this apparatus, a mask pattern is not imaged as a whole in one step. The mask pattern is illuminated by a beam having a narrow, rectangular or circularly segment-shaped, beam cross-section. The mask pattern and the substrate are moved synchronously with respect to the system, while taking the magnification of the projection system into account, so that all sub-areas of the mask pattern are consecutively imaged on corresponding sub-areas of the substrate. Since the cross-section of the projection beam in one direction, for example, the X direction, is already small in such an apparatus, only the beam cross-section in the other direction, for example, the Y direction should be decreased so as to obtain an optimal illumination for the novel method.

Figure 20:
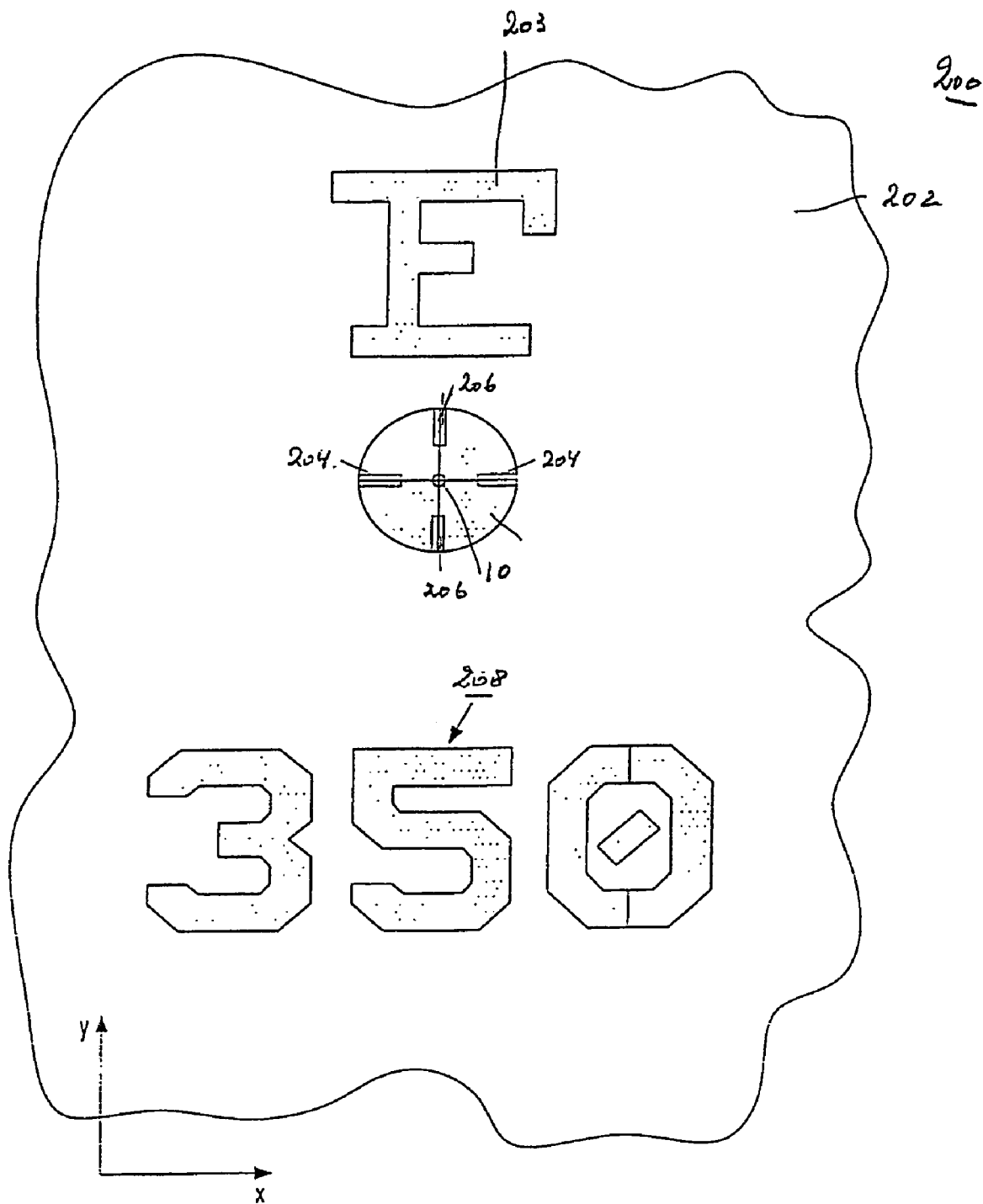
FIG. 20 shows a small part of a test mask provided with a delta test feature and reference marks.

The test object(s) cover(s) only a very small part of the mask surface area. If an entirely transparent test mask is used, the radiation passed by the mask outside the area of the test object may have the effect of interference radiation and reduce the quality of the image of the phase structure. To prevent this, preferably a test mask is used in which only the test object features are transparent, while the rest of the mask, hereinafter referred to as outer area, has been made opaque, for example by coating it with chromium. FIG. 20 shows a part of a test mask 200 provided with a test object, which comprises a single test object feature 10 in the form of a transparent opening in a non-transparent area 12. This area and the outer area 202 may be coated with a chromium layer.

To achieve that a scanning electron microscope, or another scanning detection device, can easily find the small test object, a recognition mark 203 is provided in the test mask and in the outer area of each test object, as is shown in FIG. 20. This mark, which is formed by an F-shaped opening in the chromium layer in the example shown, may be an arbitrary mark, provided that it has details extending in both the x direction and the y direction. As is shown by FIG. 20, the strips extending in the x direction and the strips extending in the y direction of the recognition mark are considerably larger than the delta test feature 10. This mark is thus more easily observable and is suitable for navigation of the detection device. As soon as this mark has been observed, the detection device can be directed within the area on the substrate, which corresponds to the outer area 202 of the test mask. The detection device then starts searching the image of the test feature 10 and scans its intensity distribution. In the area 12 transparent strips 204 in the x direction and transparent strips 206 in the y direction may be present so as to simplify the navigation of the detection device within the area 12.

Further information may be provided, as is denoted by the reference numeral 208 in the outer area 202 of a test object. This information may relate parameters of the test object or may be position information and indicate the x and y coordinate of the relevant test object on the test mask. Further information, which may be useful for performing the method, may also be provided in the recognition mark 203.

Since the marks 202 and 208 have relatively large details, these details will always be imaged in such a way that they are still reasonably recognizable for the scanning detection device, even if the imaging circumstances are not ideal, for example, if the quantity of illumination used is not optimal. If, for example, a too small quantity of illumination were used, the quality of the image of the test feature 10 would be reduced to such an extent that the method can no longer be used satisfactorily. By observing the mark 203 and/or 208, the cause of the poor image quality can be ascertained, so that the circumstances can be adapted thereto in such a way that a usable image of the phase pattern is as yet obtained and the method can still be used.

It has hitherto been assumed that the test feature of the test object is a transparent opening in a non-transparent area. The test feature may, however, also consist of a minute non-transparent area within a larger transparent area. It is also possible that the test feature is a phase structure consisting of minute area at a level different from that of the surrounding area. If a reflecting production mask is used in the lithographic apparatus, the detection method is performed with a reflecting test mask. The above mentioned three possibilities for a transmission test object can also be used for a reflective test object. For such an object the terms transparent and non-transparent used for a transmission test object should be replaced by the terms reflective and non-reflective, respectively.

The text herein before only describes measurements on a projection lens system for a lithographic apparatus. However, the projection system for such an apparatus may also be a mirror projection system. Such a projection system must be used if EUV radiation is used as projection radiation. EUV, or extreme ultraviolet, radiation is understood to mean radiation at a wavelength in the range of several nm to several tens of nm. This radiation is also referred to as soft X-ray radiation. The use of EUV radiation provides the great advantage that extremely small details, of the order of 0.1 µm or less, can be imaged satisfactorily. In other words, an imaging system in which EUV radiation is used has a very high resolution without the NA of the system having to be extremely large so that also the depth of focus of the system still has a reasonably large value. Since no suitable material, which is sufficiently transparent and suitable for making lenses, is available for EUV radiation, a mirror projection system instead of a conventional projection lens system must be used for imaging a mask pattern on the substrate. Different embodiments of such mirror projection systems are known, which may comprise three to six mirrors. As the number of mirrors increases, the quality of the image is enhanced, but due to reflection losses, this is at the expense of the quantity of radiation on the substrate. A mirror projection system with six mirrors is described in, for example EP-A 0 779 528.

Figure 21:
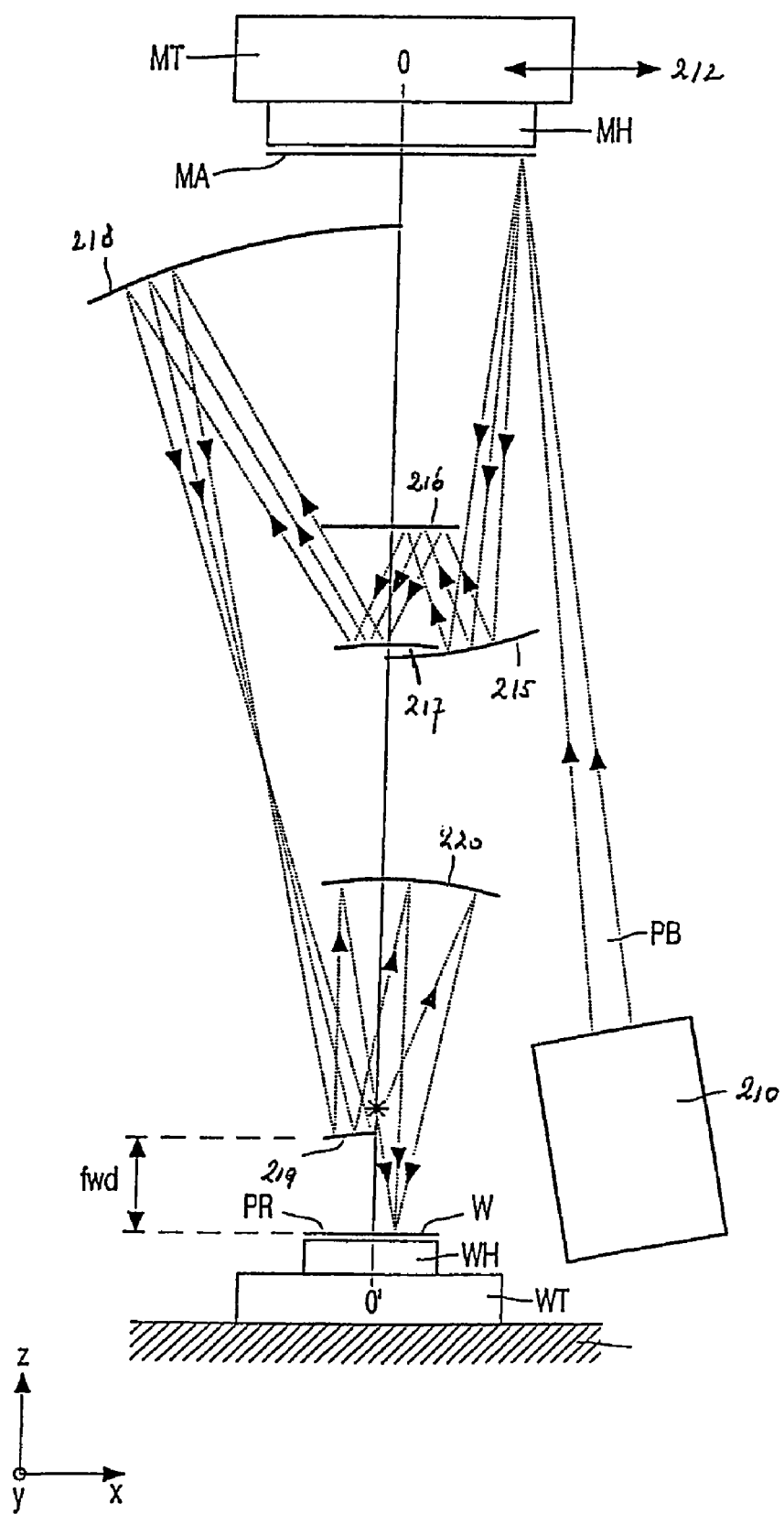
FIG. 21 shows an embodiment of a lithographic projection apparatus with a mirror projection system.

FIG. 21 shows an embodiment of another type of mirror projection system with six mirrors for a step-and-scanning lithographic projection apparatus. This apparatus may have an NA (at the image side) of the order of 0.20, a magnification M of 0.25, a circular segment-shaped image field having a width of 1.5 mm and a relatively large free working distance fwd. The apparatus comprises an illumination unit 210, shown diagrammatically, accommodating an EUV radiation source and an optical system for forming a projection beam PB whose cross-section has the shape of a circular segment. As is shown in the FIG., the illumination unit may be positioned close to the substrate table WT and the imaging section 219, 220 of the projection system so that the projection beam PB can enter the projection column closely along these elements. The mask MA' to be imaged, which is a reflective mask in this example, is arranged in a mask holder MH. This holder forms part of a mask table MT by means of which the mask can be moved in the scanning direction 212 and possibly in a direction perpendicular to the scanning direction, such that all areas of the mask pattern can be arranged under the illumination spot formed by the projection beam PB. The mask holder and -table are shown only diagrammatically and may be implemented in various ways. The substrate W is arranged on a substrate holder WH, which is supported by a substrate table WT. This table may move the substrate in the scanning direction, the X direction, but also in the Y direction perpendicular thereto. In this embodiment, the mask and the substrate move in the same direction during scanning. A block 214 supports the substrate table.

The projection beam is reflected by the reflective mask MA towards a first, concave, mirror 215. This mirror reflects the beam as a converging beam to a second mirror 216, which is slightly concave. The mirror 216 reflects the beam as a more strongly converging beam to a third mirror 217. This mirror is convex and reflects the beam as a slightly diverging beam to the fourth mirror 218. This mirror is concave and reflects the beam as a converging beam to the fifth mirror 219 which is convex and reflects the beam as a diverging beam to the sixth mirror 220. This mirror is concave and focuses the beam on the resist layer PR coated on the substrate W. The mirrors 215, 216, 217 and 218 jointly form an intermediate image of the mask. The mirrors 69 and 70 produce the desired, telecentric, image of this intermediate image on the resist layer PR.

Also the mirror projection system described above and other projection systems may have said aberrations: spherical aberration, coma, astigmatism, three-point aberration and possible further aberrations, and also these aberrations can be measured accurately and reliably by means of the novel method.

The fact that the invention has been described with reference to the measurements on a projection lens system or a mirror projection system for a lithographic projection apparatus does not mean that its application is limited thereto. The invention may be used wherever the aberrations of an imaging system must be measured independently of each other and with great accuracy and reliability. An example of such an imaging system is a space telescope. When using the novel method in a lithographic projection apparatus, an optimal use is, however, made of the fact that this apparatus itself is already intended for imaging patterns on substrates and that the imaging and servo systems of this apparatus may also be used for performing the novel method. Moreover, possible means desired for performing the method, such as said extra diaphragm, can easily be arranged in the apparatus.

Basic Formulas for the Computation of Electrical Field of a Point Spread Function The electrical field of a point spread function is U(x, y). The relationship between normalized coordinates (x, y) plus the defocus parameter $f$ and the real space image coordinates (X, Y, Z) in the lateral and axial direction:

$$x = X \frac{NA}{\lambda} \tag{1}$$
$$y = Y \frac{NA}{\lambda}$$
$$v = 2\pi\sqrt{x^2 + y^2}$$
$$f = 2\frac{\pi}{\lambda} Z \left(1 - \sqrt{1 - NA^2}\right).$$

Without loss of generality, a symmetry assumtion may be made. The full aberration function A exp(iΦ), can be expressed in terms of Zernike polynomials as $$A(\rho, \theta)\exp[i\Phi(\rho, \theta)] = \sum_{n,m} \beta_{nm} R_n^m(\rho) \cos m\theta \tag{2}$$

In general the coefficients $\beta_{nm}$ ($n \geq m \geq 0$, n–m even) are complex. The electrical field of the point spread function U is given by $$U(x, y) = 2\sum_{n,m} \beta_{nm} i^m V_{nm} \cos m\phi, \tag{3}$$

where $$V_{nm} = \int_0^1 \rho \exp(if\rho^2) R_n^m(\rho) J_m(2\pi\rho r) d\rho \tag{4}$$

for integers n, m≥0 with n–m≥0 and even. The Bessel series presentations for $V_{nm}$ reads $$V_{nm} = \exp(if) \sum_{l=1}^{\infty} (-2if)^{l-1} \sum_{j=0}^{p} v_{lj} \frac{J_{m+l+2j}(v)}{lv^l} \tag{5}$$

with $v_{lj}$ given by $$v_{lj} = \frac{(-1)^p (m+l+2j) \binom{m+j+l-1}{l-1}\binom{j+l-1}{l-1}\binom{l-1}{p-j}}{\binom{q+l+j}{l}}, \tag{6}$$

with $l = 1, 2, \ldots, j = 0, \ldots, p$. In (5) we have set $$v = 2\pi r, \ p = \frac{n-m}{2} \ q = \frac{n+m}{2}. \tag{7}$$

For the number L of terms to be included in the infinite series over l the following rule is used: if L is three times the defocus parameter, the absolute truncation error is of the order $10^{-6}$.

Determination of the Aberrations

The observed quantity is the image intensity $I(x, y, f) = |U(x, y, f)|^2$. Usually the image intensity is defined for rectangular coordinates. For retrieval of the aberrations the following steps are performed:

1. The observed image intensity is transformed to polar coordinates $I(r, \Phi, f)$.
2. A Fourier expansion is made of the observed image intensity:

$$\Psi^m(r, f) = \frac{1}{2\pi} \int_0^{2\pi} I(r, \phi, f) \cos m\phi \, d\phi \tag{8}$$

3. An inner product is defined in the (r, $f$) space:

$$(\Psi, \Phi) = \int_0^R \int_{-F}^{F} r \cdot \Psi(r, f) \cdot \Phi(r, f) dr df \tag{9}$$

For a well corrected lens, A in Eq.(2) equals unity and the aberration phase Φ is sufficiently small, so that in a first order approximation:

$$\Phi = \sum_{nm} \alpha_{nm} R_n^m(\rho) \cos(m\theta), \text{ with real } \alpha_{nm} \tag{10}$$

$$U \approx 2V_{00} + 2i \sum_{n,m} \alpha_{nm} i^m V_{nm} \cos m\phi,$$

$$I \sim 4|V_{00}|^2 + 8 \sum_{nm} i^{m+1} \alpha_{nm} \text{Re}\{V_{00} V_{nm}^*\} \cos m\phi \tag{11}$$

the $\alpha_{nm}$ are the coefficients of the single aberrations $R_n^m(\rho) \cos m\phi$ in Φ and are to be estimated from I. We denote:

$$\Psi_n^m(r, f) = 4\text{Re}\{i^{m+1} V_{00} V_{nm}^*\}, \ a_l^m = \alpha_{m+2l,m}, \tag{12}$$

where n=m+2l and l=0, 1, . . . . Then:

$$\sum_{l=0}^{\infty} a_l^m \Psi_{m+2l}^m(r, f) = \Psi^m(r, f) \tag{13}$$

By taking the inner product, defined above, of Eq.(13) with $\psi^{m+2k,m}$ the quantities $\alpha^m$, and thus the Zernike coefficients, can be found on solving a linear system of equations. When the summation of the left hand side of Eq.(13) is restricted to 0, . . . , L, the linear combination of the $\psi_{m+2l}^m$, obtained by solving the (L+1)×(L+1) linear system, gives the least square approximation of $\psi^m$ as a linear combination of the $\psi_{m+2l}^m$, l=0, . . . , L. The solution is the best linear combination that one can obtain from the experimentally observed intensity profile using L+1 terms in Eq.(13).

TABLE I

| | |
|---|---|
| Z1 | 1 |
| Z2 | Rcosφ |
| Z3 | Rsinφ |
| Z4 | $2r^2 - 1$ |
| Z5 | $r^2 - 1$ |
| Z6 | $r^2 \cos 2\phi$ |
| Z7 | $(3r^3 - 2r) \cos\phi$ |
| Z8 | $(3r^3 - 2r) \sin\phi$ |
| Z9 | $6r^4 - 6r^2 + 1$ |

TABLE I-continued

| | |
|---|---|
| Z10 | $r^3 \cos3\phi$ |
| Z11 | $r^3 \sin3\phi$ |
| Z12 | $(4r^4 - 3r^2)\cos2\phi$ |
| Z13 | $(4r^4 - 3r^2)\sin2\phi$ |
| Z14 | $(10r^5 - 12r^3 + 3r)\cos\phi$ |
| Z15 | $(10r^5 - 12r^3 + 3r)\sin\phi$ |
| Z16 | $20r^6 - 30r^4 + 12r^2 - 1$ |
| Z17 | $r^4 \cos4\phi$ |
| Z18 | $r^4 \sin4\phi$ |
| Z19 | $(5r^5 - 4r^3)\cos3\phi$ |
| Z20 | $(5r^5 - 4r^3)\sin3\phi$ |
| Z21 | $(15r^6 - 20r^4 + 6r^2)\cos2\phi$ |
| Z22 | $(15r^6 - 20r^4 + 6r^2)\sin2\phi$ |
| Z23 | $(35r^7 - 60r^5 + 30r^3 - 4r)\cos\phi$ |
| Z24 | $(35r^7 - 60r^5 + 30r^3 - 4r)\sin\phi$ |
| Z25 | $70r^8 - 140r^6 + 90r^4 - 20r^2 + 1$ |
| Z26 | $r^5 \cos5\phi$ |
| Z27 | $r^5 \sin5\phi$ |
| Z28 | $(6r^6 - 5r^4)\cos4\phi$ |
| Z29 | $(6r^6 - 5r^4)\sin4\phi$ |
| Z30 | $(21r^7 - 30r^5 + 10r^3)\cos3\phi$ |
| Z31 | $(21r^7 - 30r^5 + 10r^3)\sin3\phi$ |
| Z32 | $(56r^8 - 105r^6 + 60r^4 - 10r^2)\cos2\phi$ |
| Z33 | $(56r^8 - 105r^6 + 60r^4 - 10r^2)\sin2\phi$ |
| Z34 | $(126r^9 - 280r^7 + 210r^5 - 60r^3 + 5r)\cos\phi$ |
| Z35 | $(126r^9 - 280r^7 + 210r^5 - 60r^3 + 5r)\sin\phi$ |
| Z36 | $25r^{10} - 630r^8 + 560r^6 - 210r^4 + 30r^2 - 1$ |
| Z37 | $924r^{12} - 277r^{10} + 3150r^8 - 1680r^6 + 420r^4 - 42r^2 + 1$ |

The invention claimed is:

1. A method of determining the aberration of an optical imaging system, which method comprises the steps of:

arranging a test object in the object plane of the imaging system;

forming a number of test object images by means of the imaging system and an imaging beam, each test object image being formed with another focus state of the imaging system;

detecting the test object image by means of a detection device having a resolution larger than that of imaging system, and analyzing an output signal of the detection device to determine values of different aberration terms of the aberration, characterized in that the step of arranging the test object comprises including at least one test object feature having a size small compared to the resolution of the imaging system;

the step of detecting the test object image comprises detecting for all images of a test object features the intensity profile across the whole image plane area associated with this test object feature, which image plane area is substantially larger than the first ring of the Airy distribution of the image of the test object feature, and the step of analyzing comprises solving at least one set of equations including radial parts of point spread functions, which result from the different aberration terms, to retrieve these aberration terms.

2. A method as claimed in claim 1, characterized in that the step of forming a test object image comprises imaging a matrix of test object features arranged at a mutual distance substantially larger than the size of the test object features.

3. A method as claimed in claim 1, characterized in that the step of forming a test object image comprises forming a test object image in a resist layer, in that this layer is developed and in that the developed image is measured by a scanning detection device.

4. A method as claimed in claim 3, characterized by the additional step of imaging a reference feature for each test object feature in the resist layer before developing the resist layer.

5. A method as claimed in claim 4, characterized in that the additional step comprises forming a point-shaped reference feature in the center of the image field each test object feature.

6. A method as claimed in claim 5, characterized in that the additional step comprises forming a circle-shaped reference feature at the rim of the image field of each test object feature.

7. A method as claimed in claim 5, characterized in that the additional step comprises forming pairs of opposite line-shaped reference features in the image field of each test object feature.

8. A method as claimed in claim 1, characterized in that the step of forming a test object image comprises forming an aerial image on a radiation-sensitive detector.

9. A method as claimed in claim 8, characterized in that the step of forming a test object image comprises simultaneously forming an aerial image of each test object feature on a separate detector area.

10. A method as claimed in claim 1, for detecting aberrations in a lithographic projection apparatus suitable for projecting a mask pattern, present in a production mask, on a production substrate provided with a resist layer, characterized in that a mask having at least one test object feature is arranged at the position of the production mask in the projection apparatus and in that either a resist layer or a radiation-sensitive detection device is arranged at the position of the production substrate.

11. A method as claimed in claim 10 characterized in that use is made of a test object, which forms part of a test mask.

12. A method as claimed in claim 10 characterized in that use is made of a test object, which forms part of a production mask.

13. A system for imaging a test object having at least one test object feature, the system comprising:

a detector configured to detect an intensity distribution in an image of said at least one test object feature including detecting for all images of a test object features an intensity profile across the whole image plane area associated with this test object feature, wherein the image plane area is substantially larger than a first ring of an Airy distribution of the image of the test object feature;

an image processor, coupled to the detector and configured to:

analyze said intensity distribution including solving at least one set of equations including radial parts of point spread functions, which result from different aberration terms, to retrieve the different aberration terms.

14. A system as claimed in claim 13, wherein the detector comprises a scanning detection device for scanning a test feature image formed and developed in a resist layer configured to receive the test feature image of the at least one test object feature.

15. A system as claimed in claim 13, wherein the detector comprises a radiation-sensitive detector for receiving an aerial image of the at least one test object feature.

16. A system as claimed in claim 13, wherein the detector is a scanning point detector.

17. A system as claimed in claim 13, characterized in that the test object comprises an number of test object features and in that the detector is a scanning composed detector comprising a radiation-sensitive member and a number of transparent point-like areas, corresponding to the number of test features in the test object.

18. A system as claimed in claim 17, characterized in that the radiation-sensitive member is a single element covering all transparent areas.

19. A system as claimed in claim 17, characterized in that the radiation sensitive member is composed of a number of sub-members, which number corresponds to the number of transparent areas.

20. A system as claimed in claim 19, characterized in that the position of a transparent area relative to the center of the corresponding sub-member is different for the several transparent area/sub-member pairs.

21. A system as claimed in claim 19, characterized in that the several transparent areas are arranged at different distances from the imaging system.

22. A lithographic projection apparatus for imaging a production mask pattern, present in a mask, on a substrate, the lithographic projection apparatus comprising:

an illumination unit for supplying a projection beam, a mask holder for accommodating a mask, and a substrate holder for accommodating the substrate and for arranging a test object in an object plane in order to form a number of test object images by an imaging beam of an imaging system, each test object image being formed with another focus state of the imaging system, the test object including at least one test object feature having a size small compared to a resolution of the imaging system;

a detector configured to detect the test object image, the detector having a resolution larger than that of the imaging system and being further configure to detect, for all images of test object features, an intensity profile across a whole image plane area associated with this test object feature, wherein the image plane area is substantially larger than a first ring of the Airy distribution of the image of the test object feature, and a processor configured to analyze an output signal of the detector to determine values of different aberration terms of the aberration, the processor being further configured to solve at least one set of equations including radial parts of point spread functions, a projection system arranged between the mask holder and the substrate holder, wherein the projection system is configured to provide the projection beam for use as imaging beam, the illumination unit comprising means for reducing a diameter of a cross-section of the projection beam to a value smaller than a cross-section diameter the projection beam has during projection of a production mask pattern.

23. A lithographic projection apparatus for imaging a production mask pattern, present in a mask, on a substrate, the lithographic projection apparatus comprising:

an illumination unit for supplying a projection beam, a mask holder for accommodating a mask, a substrate holder for accommodating the substrate, a projection system arranged between the mask holder and the substrate holder, means for arranging a test object in the object plane of the imaging system, the test object including at least one test object feature having a size small compared to a resolution of the imaging system;

means for forming a number of test object images by means of the imaging system and an imaging beam, each test object image being formed with another focus state of the imaging system;

means for detecting the test object image by means of a detection device having a resolution larger than that of imaging system including detecting, for all images of a test object features, an intensity profile across a whole image plane area associated with this test object feature, which image plane area is substantially larger than the first ring of the Airy distribution of the image of the test object feature, the means for detecting further include an aerial image detecting radiation-sensitive detector configured to detect an intensity distribution in an image of said at least one test object feature, and means for analyzing an output signal of the detection device to determine values of different aberration terms of the aberration including solving at least one set of equations having radial parts of point spread functions, which result from the different aberration terms, to retrieve these aberration terms, wherein said apparatus comprises an aerial image detecting radiation-sensitive detector configured to detect an intensity distribution in an image of said at least one test object feature.

* * * * *